US010075182B2

(12) United States Patent
Park et al.

(10) Patent No.: US 10,075,182 B2
(45) Date of Patent: Sep. 11, 2018

(54) MESSAGE COMPRESSION

(75) Inventors: Vincent Park, Budd Lake, NJ (US); George Tsirtsis, New York, NY (US); Hesham Soliman, Endeavour Hills (AU)

(73) Assignee: QUALCOMM Incorporated, San Diego, CA (US)

( * ) Notice: Subject to any disclaimer, the term of this patent is extended or adjusted under 35 U.S.C. 154(b) by 1094 days.

(21) Appl. No.: 11/581,217

(22) Filed: Oct. 13, 2006

(65) Prior Publication Data

US 2008/0089357 A1   Apr. 17, 2008

(51) Int. Cl.
H04J 3/16      (2006.01)
H03M 7/30      (2006.01)

(52) U.S. Cl.
CPC ....................................  H03M 7/30 (2013.01)

(58) Field of Classification Search
USPC ......... 370/354, 465, 477, 395; 709/206, 227
See application file for complete search history.

(56) References Cited

U.S. PATENT DOCUMENTS

| | | | |
|---|---|---|---|
| 4,386,416 A | 5/1983 | Giltner et al. | |
| 5,987,022 A | 11/1999 | Geiger et al. | |
| 6,021,325 A * | 2/2000 | Hall | H04M 1/7255 455/412.1 |
| 6,324,207 B1 * | 11/2001 | Kanterakis | H04B 1/707 370/332 |
| 6,542,992 B1 | 4/2003 | Peirce, Jr. et al. | |
| 6,567,664 B1 | 5/2003 | Bergenwall et al. | |
| 7,110,776 B2 | 9/2006 | Sambin | |

(Continued)

FOREIGN PATENT DOCUMENTS

| | | |
|---|---|---|
| CN | 1121674 A | 5/1996 |
| CN | 1235349 A | 11/1999 |

(Continued)

OTHER PUBLICATIONS

Adrian Mouat: "Delta Update Language (DUL)" Internet Article, (Online) Jun. 2002 (Jun. 2002), XP002467769.

(Continued)

Primary Examiner — Anez Ebrahim
(74) Attorney, Agent, or Firm — Muncy, Geissler, Olds & Lowe, P.C.

(57) ABSTRACT

Methods and apparatus related to message compression/decompression are described. A compressed message is generated by indicating what changes are to be made to a previous message to produce the message sought to be transmitted. The required change, in the form of at least one command and corresponding parameter, is transmitted as a compressed version of the message being communicated. This approach takes advantage of the fact that messages sent over time often include much of the same message content and only one or a few fields may have changed. The techniques are general and involve including a command in the compressed message along with at least one parameter. The command indicates processing to be performed on a previous message to generate the uncompressed message. The parameter may be, e.g., data to be inserted into the previous message or specify a location in the previous message where the change is to be made.

96 Claims, 21 Drawing Sheets

(56) References Cited

U.S. PATENT DOCUMENTS

| | | | |
|---|---|---|---|
| 7,218,634 B1 | 5/2007 | Khalil et al. | |
| 7,224,673 B1 | 5/2007 | Leung et al. | |
| 8,165,124 B2 | 4/2012 | Tsirtsis et al. | |
| 2002/0057715 A1* | 5/2002 | Hannu | H03M 7/30 370/477 |
| 2002/0057716 A1 | 5/2002 | Svanbro et al. | |
| 2002/0083135 A1* | 6/2002 | Koudu | G06F 12/023 709/204 |
| 2003/0074452 A1 | 4/2003 | Zheng et al. | |
| 2003/0153325 A1 | 8/2003 | Veerepalli et al. | |
| 2004/0057525 A1 | 3/2004 | Rajan et al. | |
| 2004/0062220 A1* | 4/2004 | Bolgiano | G01S 5/14 370/334 |
| 2004/0083488 A1* | 4/2004 | Fukuda et al. | 725/38 |
| 2005/0027731 A1* | 2/2005 | Revel | 707/101 |
| 2005/0074099 A1* | 4/2005 | Marsot | H04M 3/53366 379/88.13 |
| 2005/0094647 A1* | 5/2005 | Hata et al. | 370/395.52 |
| 2005/0231765 A1* | 10/2005 | So | G06F 17/30315 358/1.16 |
| 2006/0092873 A1* | 5/2006 | Khayrallah | H04L 1/0001 370/329 |
| 2006/0242457 A1 | 10/2006 | Roy et al. | |
| 2007/0003028 A1 | 1/2007 | Korah et al. | |
| 2007/0047657 A1* | 3/2007 | Toma | G10L 19/012 375/240.24 |
| 2007/0195764 A1 | 8/2007 | Liu et al. | |
| 2008/0109521 A1* | 5/2008 | Mousseau | G06Q 10/107 709/206 |

FOREIGN PATENT DOCUMENTS

| | | |
|---|---|---|
| CN | 1269946 A | 10/2000 |
| EP | 1180871 A2 | 2/2002 |
| WO | WO9913658 A1 | 3/1999 |
| WO | WO 00/79760 | 12/2000 |
| WO | WO 01/89157 | 11/2001 |
| WO | 02011397 | 2/2002 |
| WO | WO 03/090425 | 10/2003 |
| WO | 04004277 | 1/2004 |
| WO | WO 2004/034670 | 4/2004 |
| WO | 05052736 | 6/2005 |

OTHER PUBLICATIONS

Ching Shen Tye, Dr. G. Fairhurst: "A Review of IP Packet Compression Techniques" Internet Article, (Online) 2003, XP002467693.

Christian Werner, Carsten Buschmann, Stefan Fischer: "Compressing SOAP Messages by using Differential Encoding" IEEE, Internet Article, (Online) 2004, XP002467688.

DXPC Design: "Brian Pane" Internet Article, (Online) Sep. 23, 2003 (Sep. 23, 2003), XP002467689.

Emre Ertekin and Chris Christou, Booz Allen Hamilton: "Internet Protocol Header Compression, Robust Header Compression, and Their Applicability in the Global Information Grid" Internet Article, (Online) Nov. 2004 (Nov. 2004), XP002467691.

Gian Filippo Pinzari: "NX X Protocol Compression" Internet Article, (Online) Sep. 26, 2003 (Sep. 26, 2003), XP002467687.

International Search Report—PCT/US07/081352, International Search Authority—European patent Office—dated Feb. 15, 2008.

Jacobson V: "Compressing TCP/IP Headers for Low-Speed Serial Links" Internet Citation, (Online) Feb. 1990 (Feb. 1990), XP002139708.

Jacobson/1/LBL V: "for Low-Speed Serial Links Compressing TCP/IP Headers; rfc1144.txt" IETF Standard Internet Engineering Task Force, IETF, CH, Feb. 1990 (Feb. 1990) XP015006085.

Mikael Degermark, Mathias Engan, Bj"orn Nordgren, Stephen Pink: "Low-loss TCP/IP header compression for wireless networks" Internet Article, (Online) 1997, XP002467692.

Miklos Ajtai: "Compactly Encoding Unstructured Inputs with Differential Compression" Journal of the ACM, (Online) vol. 49, No. 3, May 2002 (May 2002), XP002467726.

Mogul J et al: "Delta Encoding in HTTP" Network Working Group Request for Comments, Jan. 2002 (Jan. 2002), page Complete, XP001100639.

N. Giouroukos, G. Orphanos: "An implementation of ROHC for TCP/IPv6" Internet Article, (Online) 2004, XP002467690.

Written Opinion—PCT/US07/081352, International Search Authority—European patent Office—dated Feb. 15, 2008.

Taiwanese Search report—096138553—TIPO—Dec. 12, 2010.

* cited by examiner

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |     Length    |    Command Dependent Info ...
+-+-+-+-+-+-+-+-+-+-+-+-+-+-+-+-+-+-+-+-+-+-+-+-+-+-+-+-+-+-+-+-+
```

FIGURE 15

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |     Length    |             Offset            |
+-+-+-+-+-+-+-+-+-+-+-+-+-+-+-+-+-+-+-+-+-+-+-+-+-+-+-+-+-+-+-+-+
|           NumUnits            |
+-+-+-+-+-+-+-+-+-+-+-+-+-+-+-+-+
```

FIGURE 16

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |     Length    |             Offset            |
+-+-+-+-+-+-+-+-+-+-+-+-+-+-+-+-+-+-+-+-+-+-+-+-+-+-+-+-+-+-+-+-+
|    Data   ...
+-+-+-+-+-+-+-+-+-+
```

FIGURE 17

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |    Length     |            Offset             |
+-+-+-+-+-+-+-+-+-+-+-+-+-+-+-+-+-+-+-+-+-+-+-+-+-+-+-+-+-+-+-+-+
|           NumUnits            |    Data  ...
+-+-+-+-+-+-+-+-+-+-+-+-+-+-+-+-+-+-+-+-+-+-+-+
```

FIGURE 18

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |    Length     |            Offset             |
+-+-+-+-+-+-+-+-+-+-+-+-+-+-+-+-+-+-+-+-+-+-+-+-+-+-+-+-+-+-+-+-+
|   Data  ...
+-+-+-+-+-+-+-+-+-+
```

FIGURE 19

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|    Command    |    Length     |            Offset             |
+-+-+-+-+-+-+-+-+-+-+-+-+-+-+-+-+-+-+-+-+-+-+-+-+-+-+-+-+-+-+-+-+
|           NumUnits            |
+-+-+-+-+-+-+-+-+-+-+-+-+-+-+-+-+
```

FIGURE 20

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |S|B|D|M|G|r|T|x|          Lifetime             |
+-+-+-+-+-+-+-+-+-+-+-+-+-+-+-+-+-+-+-+-+-+-+-+-+-+-+-+-+-+-+-+-+
|                         Home Address                          |
+-+-+-+-+-+-+-+-+-+-+-+-+-+-+-+-+-+-+-+-+-+-+-+-+-+-+-+-+-+-+-+-+
|                          Home Agent                           |
+-+-+-+-+-+-+-+-+-+-+-+-+-+-+-+-+-+-+-+-+-+-+-+-+-+-+-+-+-+-+-+-+
|                        Care-of Address                        |
+-+-+-+-+-+-+-+-+-+-+-+-+-+-+-+-+-+-+-+-+-+-+-+-+-+-+-+-+-+-+-+-+
|                                                               |
+                         Identification                        +
|                                                               |
+-+-+-+-+-+-+-+-+-+-+-+-+-+-+-+-+-+-+-+-+-+-+-+-+-+-+-+-+-+-+-+-+
| Extensions ...
+-+-+-+-+-+-+-+-+-
```

FIGURE 21

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |    Command    |    Length     |    Offset ... |
+-+-+-+-+-+-+-+-+-+-+-+-+-+-+-+-+-+-+-+-+-+-+-+-+-+-+-+-+-+-+-+-+
| Offset (cont) |                                               |
+-+-+-+-+-+-+-+-+    Data (New Identification Field Value)      +
|                                                               |
+               +-+-+-+-+-+-+-+-+-+-+-+-+-+-+-+-+-+-+-+-+-+-+-+-+
|               |
+-+-+-+-+-+-+-+-+
```

FIGURE 22

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |              Home Address (HoA)               |
+-+-+-+-+-+-+-+-+-+-+-+-+-+-+-+-+-+-+-+-+-+-+-+-+-+-+-+-+-+-+-+-+
|   HoA (Cont)  |    CompID     |Command=Replace|    Length     |
+-+-+-+-+-+-+-+-+-+-+-+-+-+-+-+-+-+-+-+-+-+-+-+-+-+-+-+-+-+-+-+-+
|        Offset=19bytes         |        Data = 34 00 02        |
+-+-+-+-+-+-+-+-+-+-+-+-+-+-+-+-+-+-+-+-+-+-+-+-+-+-+-+-+-+-+-+-+
|  Data (Cont)  |Command=Replace|    Length     |Offset = 8bytes|
+-+-+-+-+-+-+-+-+-+-+-+-+-+-+-+-+-+-+-+-+-+-+-+-+-+-+-+-+-+-+-+-+
|  Offset(Cont) |                                               |
+-+-+-+-+-+-+-+-+                                               +
|                                                               |
+   Data = e6 21 60 13 b3 3e 7f a8 4f ac af 6d 78 83 28 9a      +
|                                                               |
+                                                               +
|                                                               |
+               +-+-+-+-+-+-+-+-+-+-+-+-+-+-+-+-+-+-+-+-+-+-+-+-+
|               |
+-+-+-+-+-+-+-+-+
```

FIGURE 23

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |    Length     |C|            Reserved         |
+-+-+-+-+-+-+-+-+-+-+-+-+-+-+-+-+-+-+-+-+-+-+-+-+-+-+-+-+-+-+-+-+
```

FIGURE 24

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |    Length     |A|B|C|D|E|F|G|H|I|K|L| Resvd   |
+-+-+-+-+-+-+-+-+-+-+-+-+-+-+-+-+-+-+-+-+-+-+-+-+-+-+-+-+-+-+-+-+
|  (A)Type   (B)|S|B|D|M|G|r|T|x|         (C)Lifetime           |
+-+-+-+-+-+-+-+-+-+-+-+-+-+-+-+-+-+-+-+-+-+-+-+-+-+-+-+-+-+-+-+-+
|                       (D)Home Address                         |
+-+-+-+-+-+-+-+-+-+-+-+-+-+-+-+-+-+-+-+-+-+-+-+-+-+-+-+-+-+-+-+-+
|                        (E)Home Agent                          |
+-+-+-+-+-+-+-+-+-+-+-+-+-+-+-+-+-+-+-+-+-+-+-+-+-+-+-+-+-+-+-+-+
|                       (F)Care-of Address                      |
+-+-+-+-+-+-+-+-+-+-+-+-+-+-+-+-+-+-+-+-+-+-+-+-+-+-+-+-+-+-+-+-+
|                                                               |
+                       (G)Identification                       +
|                                                               |
+-+-+-+-+-+-+-+-+-+-+-+-+-+-+-+-+-+-+-+-+-+-+-+-+-+-+-+-+-+-+-+-+
|                    (H)Last Care-of Address                    |
+-+-+-+-+-+-+-+-+-+-+-+-+-+-+-+-+-+-+-+-+-+-+-+-+-+-+-+-+-+-+-+-+
|                      (I)Mobile Identifier                     |
+-+-+-+-+-+-+-+-+-+-+-+-+-+-+-+-+-+-+-+-+-+-+-+-+-+-+-+-+-+-+-+-+
|    (K)CompressionID           |   MN-HA Extensions ...        |
+-+-+-+-+-+-+-+-+-+-+-+-+-+-+-+-+-+-+-+-+-+-+-+-+-+-+-+-+-+-+-+-+
|                                                               |
+                                                               +
|                                                               |
+              (L)Mobile - Home Authentication                  +
|                                                               |
+                                                               +
|                                                               |
+                                                               +
|                                                               |
+-+-+-+-+-+-+-+-+-+-+-+-+-+-+-+-+-+-+-+-+-+-+-+-+-+-+-+-+-+-+-+-+
| MN-FA Extensions...
+-+-+-+-+-+-+-+-+-+-+-+-+-+-++-+-+-+-+-+
```

FIGURE 25

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |A|B|C|D|E|F|G|H|       (A)Lifetime             |
+-+-+-+-+-+-+-+-+-+-+-+-+-+-+-+-+-+-+-+-+-+-+-+-+-+-+-+-+-+-+-+-+
|                      (B)Home Address                          |
+-+-+-+-+-+-+-+-+-+-+-+-+-+-+-+-+-+-+-+-+-+-+-+-+-+-+-+-+-+-+-+-+
|                       (C)Home Agent                           |
+-+-+-+-+-+-+-+-+-+-+-+-+-+-+-+-+-+-+-+-+-+-+-+-+-+-+-+-+-+-+-+-+
|                      (D)Care-of Address                       |
+-+-+-+-+-+-+-+-+-+-+-+-+-+-+-+-+-+-+-+-+-+-+-+-+-+-+-+-+-+-+-+-+
|                                                               |
+                       (E)Identification                       +
|                                                               |
+-+-+-+-+-+-+-+-+-+-+-+-+-+-+-+-+-+-+-+-+-+-+-+-+-+-+-+-+-+-+-+-+
|                   (F)Last Care-of Address                     |
+-+-+-+-+-+-+-+-+-+-+-+-+-+-+-+-+-+-+-+-+-+-+-+-+-+-+-+-+-+-+-+-+
|                     (G)Mobile Identifier                      |
+-+-+-+-+-+-+-+-+-+-+-+-+-+-+-+-+-+-+-+-+-+-+-+-+-+-+-+-+-+-+-+-+
|    (H)CompressionID           |      Extensions ...
+-+-+-+-+-+-+-+-+-+-+-+-+-+-+-+-+-++-+-+-+-+-+-+-+
```

FIGURE 26

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |     Code      |         Lifetime              |
+-+-+-+-+-+-+-+-+-+-+-+-+-+-+-+-+-+-+-+-+-+-+-+-+-+-+-+-+-+-+-+-+
|                                                               |
+                       Identification                          +
|                                                               |
+-+-+-+-+-+-+-+-+-+-+-+-+-+-+-+-+-+-+-+-+-+-+-+-+-+-+-+-+-+-+-+-+
| Extensions ...
+-+-+-+-+-+-+-+-
```

FIGURE 27

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |    Length     |A|B|C|D|E|F|G|H|    CompID     |
+-+-+-+-+-+-+-+-+-+-+-+-+-+-+-+-+-+-+-+-+-+-+-+-+-+-+-+-+-+-+-+-+
|                         Home Address                          |
+-+-+-+-+-+-+-+-+-+-+-+-+-+-+-+-+-+-+-+-+-+-+-+-+-+-+-+-+-+-+-+-+
|                                                               |
+                         Identification                        +
|                                                               |
+-+-+-+-+-+-+-+-+-+-+-+-+-+-+-+-+-+-+-+-+-+-+-+-+-+-+-+-+-+-+-+-+
|                                                               |
+                                                               +
|                                                               |
+                   Mobile - Home Authentication                +
|                                                               |
+                                                               +
|                                                               |
+-+-+-+-+-+-+-+-+-+-+-+-+-+-+-+-+-+-+-+-+-+-+-+-+-+-+-+-+-+-+-+-+
```

FIGURE 28

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
|     Type      |    Length     |C|A|N|    Reserved             |
+-+-+-+-+-+-+-+-+-+-+-+-+-+-+-+-+-+-+-+-+-+-+-+-+-+-+-+-+-+-+-+-+
|                             CID                               |
+-+-+-+-+-+-+-+-+-+-+-+-+-+-+-+-+-+-+-+-+-+-+-+-+-+-+-+-+-+-+-+-+
```

FIGURE 29

MESSAGE COMPRESSION

FIELD OF THE INVENTION

The present invention relates to wireless communications methods and apparatus and, more particularly, to methods and apparatus for implementing and using message compression.

BACKGROUND

Compression is a technique with which some information is represented in a format that is shorter (e.g., less number of characters or bytes) than the original information with minimal or no loss of information.

In the context of wireless communications, header compression is sometimes used to compress the number of bytes required to represent a header being transmitted over an airlink, e.g., between a mobile node and a base station. While known header compression techniques are useful in compressing headers, there remains a need for additional and/or improved data compression techniques.

In particular, there is a need for methods and apparatus which can be used to compress messages and/or information communicated between one or more devices. The messages may be in accordance with, e.g., a protocol. Given that many protocols, e.g., mobile IP protocols, require the communication of multiple messages, often between the same devices, over a period of time, it would be desirable if improved methods and apparatus for reducing the amount of resources required to communicate such messages and/or message information could be developed. While improved message compression techniques are desirable, it would be desirable if there were at least some improved message compression techniques which could be applied to mobile communications signaling where messages often go over an airlink where communications resources tend to be constrained and/or expensive.

SUMMARY

Various features are directed to methods and apparatus related to message compression and decompression. This patent application describes various compression mechanisms for message compression and subsequent decompression. The various message compression and/or subsequent decompression methods can be used alone or in combination.

An exemplary mechanism is a generic mechanism that can operate without knowledge of the particular protocol or message being compressed. This generic mechanism can be applied to Mobile IP protocol messages, as well as many others.

In accordance with various embodiments, the compressed message is generated by indicating what changes are to be made to a previous message to produce the message sought to be transmitted. The required change, in the form of at least one command and corresponding parameter, is transmitted as a compressed version of the message being communicated. This approach takes advantage of the fact that messages sent over time often include much of the same message content and only one or a few fields may have changed. The techniques are general and involve including a command in the compressed message along with at least one parameter. The command indicates processing to be performed on a previous message to generate the uncompressed message. The parameter may be, e.g., data to be inserted into the previous message or specify a location in the previous message where the change is to be made. The compressed message may or may not explicitly identify the previous message upon which the modification is to be made.

An example compressed message might be:
INSERT [Message 1 Identifier] [New Data] [Offset]
where INSERT is the command, Message 1 Identifier is an explicit identifier of the previous message, New Data is the data to be inserted and Offset is an offset from the start of the previous message where the data is to be inserted.

Another compressed message example, of a very basic compressed message might be:
ADD [New Data]
in which case the message is reduced to simply a command and a parameter. A predetermined understanding may be used between the message source and destination to determine the previous message to which the compressed message relates, e.g., the destination may assume that the compressed message applies to the last received message. In this example the new data will be appended to the end of the last message thereby avoiding the need to communicate the content of the previous message.

In some instances multiple commands are included in the same compressed message. Numerous other messages/command options are possible in accordance with this approach to message compression allowing for a great deal of flexibility.

An exemplary method of receiving and processing messages, in accordance with various embodiments includes: storing a first set of message information corresponding to a first message; receiving a second message, said second message including at least one command and at least one parameter corresponding to said command; and generating a new set of message information by processing said stored first set of message information in accordance with said command. An exemplary communications apparatus in accordance with various embodiments includes: a memory including a first set of message information corresponding to a first message; a receiver module for receiving a second message, said second message including at least one command and at least one parameter corresponding to said command; and a message information generation module for generating a new set of message information by processing said stored first set of message information in accordance with said command.

Another exemplary method includes: storing a first set of message information corresponding to a first message; and generating a second message, said second message including at least one command and at least one parameter corresponding to said command, said command indicating an operation to be performed on a second set of message information to generate a new set of message information, said second set of message information having the same content as said first set of message information. An exemplary communications device in accordance with various embodiments includes: memory for storing a first set of message information corresponding to a first message; and a message generation module for generating a second message, said second message including at least one command and at least one parameter corresponding to said command, said command indicating an operation to be performed on a second set of message information to generate a new set of message information, said second set of message information having the same content as said first set of message information.

While various embodiments have been discussed in the summary above, it should be appreciated that not necessarily all embodiments include the same features and some of the features described above are not necessary but can be desirable in some embodiments. Numerous additional features, embodiments and benefits are discussed in the detailed description which follows.

BRIEF DESCRIPTION OF THE FIGURES

FIGS. 15-29 show message formats as described herein.

DETAILED DESCRIPTION

1. Compressed Flow

Figure 1:
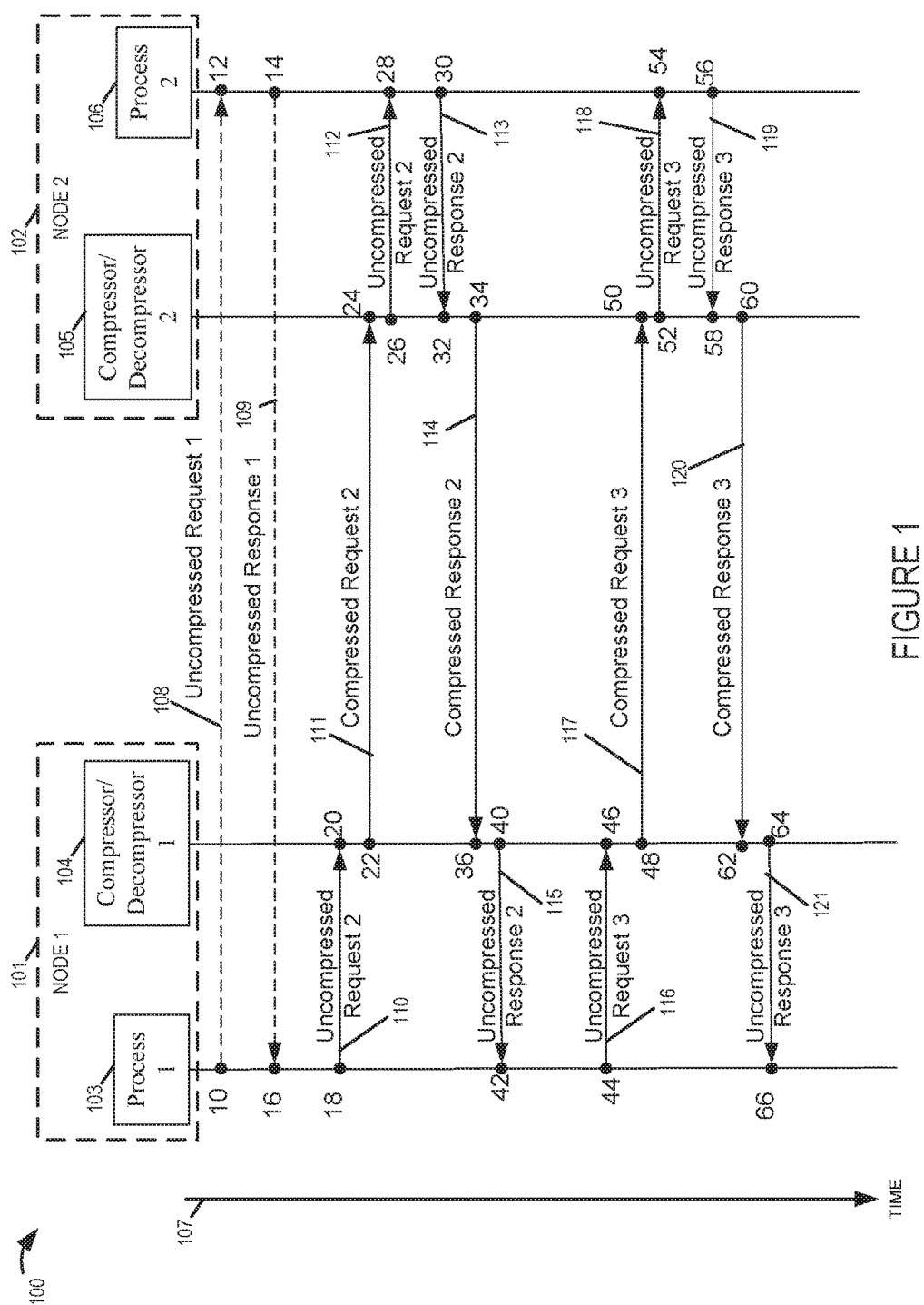
FIG. 1 is a drawing illustrating steps of compression and decompression methods used in some embodiments.

FIG. 1 is a drawing 100 illustrating the steps of the compression and decompression methods used in some embodiments.

Drawing 100 includes node 1 101, node 2 102, a time axis 107, an exemplary sequence of messages (108, 109, 110, 111, 112, 113, 114, 115, 116, 117, 118, 119, 120, 121), and points (10, 12, 14, 16, 18, 20, 22, 24, 26, 28, 30, 32, 34, 36, 40, 42, 44, 46, 48, 50, 52, 54, 56, 58, 60, 62, 64, 66) corresponding to a sequence of events on time line 107.

Process 1 103 and compressor/decompressor 1 104 are, in this exemplary embodiment, present in a first node 101, e.g., mobile node, while compressor/decompressor 2 105 and process 2 106 are, in this exemplary embodiment, present in a second node 102, e.g., an access node such as a base station.

In drawing 100 of FIG. 1 two processes (103, 106) exchange compressed and uncompressed messages. The Compressor/Decompressors (104, 105) compress and uncompress messages on behalf of the processes. The compressor/decompressor (104, 105) can be implemented as a separate process or as part of the same process as the two processes (103, 106) involved.

At point 10 the process 1 103 sends an uncompressed request 1 message 108 to process 2 106. Process 2 106 receives the message 108 at point 12, processes the message and if the message is accepted process 2 106 stores the content of the message. Process 2 106 sends an uncompressed response 1 message 109 at point 14. The response message 109 is received by process 1 103 at point 16. The response message 109 is processed and stored by process 1 103. The stored messages in process 1 103 and process 2 106 are now the context for the compression. Compressed messages can be expressed as deltas from these stored messages. Alternatively, default messages can be stored in process 1 103 and process 2 106 so that the uncompressed request 1 108 and uncompressed response 1 109 do not have to be sent.

At point 18, process 1 103 sends uncompressed request 2 110. The compressor of module 104 receives said message 110 at point 20 and compresses said message 110. The contents of Compressed Request 2 111 are expressed as a delta from uncompressed request 1 108 sent at point 10. The compressed request 2 111 is sent at point 22 and it is received at point 24 by the decompressor of module 105. The decompressor, decompresses the message 111, by applying the indicated deltas to the uncompressed request 1 108 received at point 12, and sends an uncompressed request 2 112 at point 26. The uncompressed request 2 112 is received by process 2 106 at point 28. The message 112 is processed and stored. Process 2 106 sends an uncompressed response 2 113 at point 30. The compressor of module 105 receives said message 113 at point 32 and compresses the message. The compressor sends compressed response 2 114 at point 34 and the decompressor of module 104 receives it at point 36. The decompressor decompresses the message 114. The decompressor sends the uncompressed response 2 message 115 to process 1 103 at point 40. Process 1 103 receives the message 115 at point 42, it processes it, and stores it.

At point 44, process 1 103 sends uncompressed request 3 116. The compressor of module 104 receives said message at point 46 and compresses said message 116. The contents of Compressed Request 3 117 are expressed as a delta from uncompressed request 2 110 sent at point 18. The Compressed Request 3 117 is sent at point 48 and it is received at point 50 by the decompressor of module 105. The decompressor, decompresses the message 117, by applying the indicated deltas to the Uncompressed Request 2 112 received at point 28, and sends an Uncompressed Request 3 118 at point 52. The Uncompressed Request 3 118 is received by process 2 106 at point 54. The message 118 is processed and stored. Process 2 106 sends an uncompressed response 3 119 at point 56. The compressor of module 105 receives said uncompressed response 3 message 119 at 58 and compresses the message 119. The compressor sends compressed response 3 120 at point 60 and the decompressor of module 104 receives it at point 62. The decompressor decompresses the message 120. The decompressor sends the uncompressed response 3 message 121 to process 1 103 at point 64. Process 1 103 receives the message 121 at point 66, it processes it and stores it.

If compression IDs or another indication of a known message is used (see subsequent section) any message can be compressed as a delta from any other known message, for example from any previously sent message. If compression IDs are not used then, in some embodiments, each message is compressed as a delta from the last message which was sent in the same direction.

2. Generic Protocol Message Compression

According to this compression approach, protocol messages conveyed from a first entity, e.g., the sender, to a second entity, e.g., the receiver, are differentially encoded, e.g., as a set of commands indicating similarities, differences, and/or modifications, with respect to a reference message, e.g., a previously conveyed protocol message. A differentially encoded message typically has a reduced message size with respect to a non-differentially encoded version of the same message, thus various embodiments provide a means of generic protocol message compression. The compression approach, as defined herein, is applicable to virtually any known protocol and/or to any protocol that may yet be defined in the future, but is well suited for protocols that repeatedly convey messages with a high proportion of common content between the same two entities.

2.1 Overview

Figure 2:
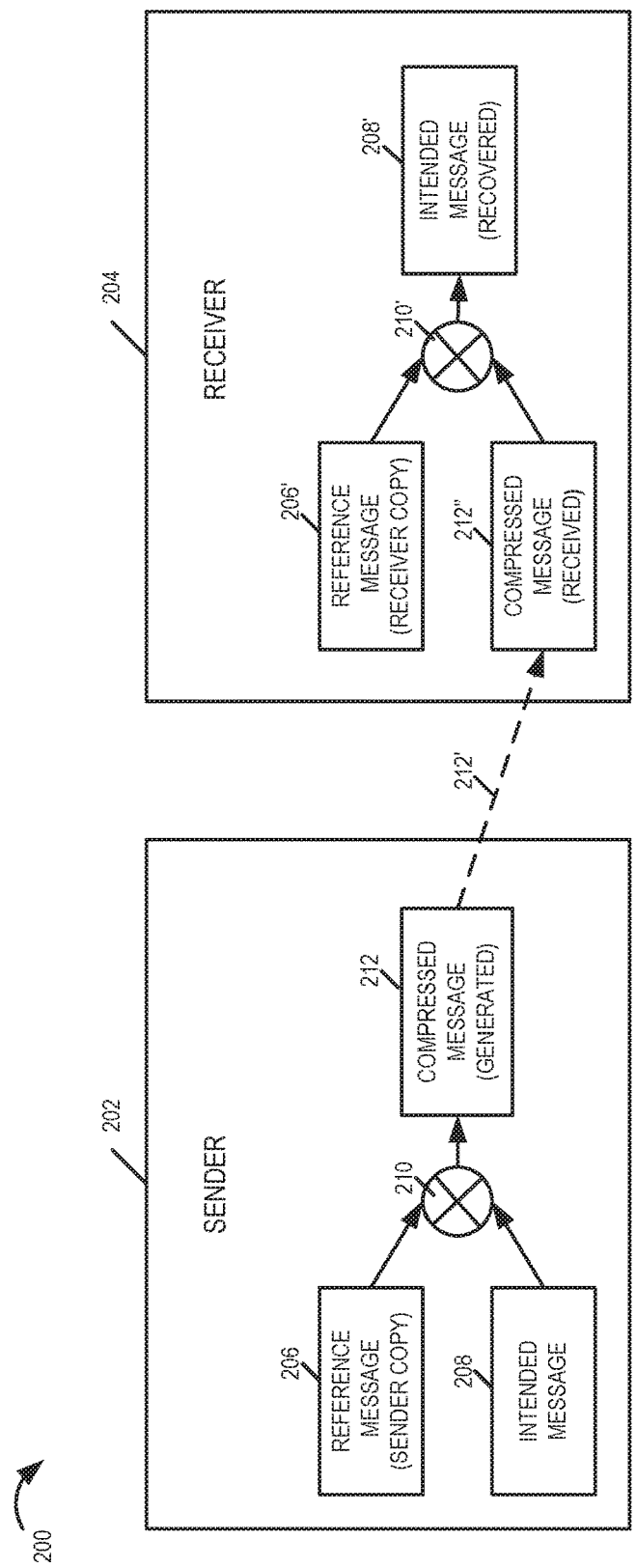
FIG. 2 is a drawing illustrating an exemplary functional relationship between a set of messages or equivalent sets of information pertaining to the sending of a differentially encoded message, also referred to as compressed message, from a sender to a receiver.

FIG. 2 is a drawing 200 illustrating an exemplary functional relationship between a set of messages or equivalent sets of information pertaining to the sending of a differentially encoded message, also referred to as compressed message, from a sender 202 to a receiver 204. The sender 202 may be, e.g., a first node such as a mobile node with the receiver 204 being a second node, e.g., a base station.

As illustrated in FIG. 2, the sender 202 generates, via compression module 210, a "compressed" message 212 based on comparison of information corresponding to a "reference" message 206, e.g., a protocol message assumed to be known to both the sender and the receiver, and information corresponding to an "intended" message 208, e.g., a protocol message to be conveyed from the sender to the receiver. The generated "compressed" message 212 is then sent, e.g., transmitted and/or forwarded, from the sender 202 to the receiver 204, e.g., over an airlink as message 212'. The receiver 204 then determines the information corresponding to the "intended" message 208' based on comparison of the received "compressed" message 212" and local information corresponding to the "reference" message 206', e.g., an equivalent copy of the "reference" message information 206 used by the sender 202 to generate the "compressed" message. The comparison used to obtain intended message 208' is performed by decompression module 210'.

Note that, although they are labeled as messages in exemplary FIG. 2 drawing and often referred to as messages herein, neither the reference messages nor the intended messages, e.g., at either the sender or the receiver, need actually be formed and/or exchanged between entities as typical messages. Alternatively, one or more of these may comprise a collection of stored information, e.g., a set of data, that is the same or equivalent in terms of content to the information corresponding to a message.

2.2 Reference Message Information

The compressed message can be viewed as a compressed version of the intended message that is differentially encoded with respect to the reference message. Decompression of the compressed message, e.g., by the receiver, thus uses information corresponding to the reference message. However, there are many alternatives regarding how the reference message information is known to both the sender and the receiver. Some examples include:

The reference message information is predetermined and/or preconfigured at both the sender and the receiver. In this case the reference message information could be . . .

defined as part of a specification or standard, hardcoded as part of an implementation, or agreed upon via some out of band mechanism.

The reference message information is a protocol message previously conveyed from the sender to the receiver. In this case the reference message information could be . . .

a previously conveyed uncompressed message, e.g., a standard protocol message sent from the sender to the receiver, or a previously conveyed intended message that corresponds to a compressed message previously sent from the sender to the receiver.

Upon reception of a compressed message, the receiver determines, e.g., identifies, the corresponding reference message information. The compressed message may include information that helps the receiver to determine the corresponding reference message information. For example, the compressed message may include information that indicates the sender, the receiver, the protocol, the application, etc. In some embodiments the corresponding reference message information is, in part, implicitly determined, e.g., the "last" uncompressed or intended message received from the sender. In some embodiments the compressed message contains additional information to more explicitly indicate the corresponding reference message information, e.g., an identifier of a particular previously conveyed uncompressed or intended message received from the sender. In some embodiments a combination of implicit and explicit means are used, e.g., the "last" uncompressed or intended message or an explicitly identified "type" received from the sender.

2.3 Compressed Message Command Primitives

In accordance with various embodiments, a compressed message includes one or more commands, e.g., primitives or operations, that instruct the receiver on how to determine the intended message from a known reference message. A parameter may be provided with the command. For example, the compressed message may include an indication of additions, deletions, and/or other modifications with respect to the reference message. There are many alternative sets of command primitives that may be used to indicate differences with respect to a reference message and thus enable the receiver to the determine the intended message. Some examples include:

SET1: Intended message initialized as an empty message; command primitives instruct sequential generation of intended message assuming only sequential access of reference message COPY (numUnits): Copy numUnits from current location in reference message to the intended message. This command effectively copies a portion of information from the reference message to the intended message.

SKIP (numUnits): Skip over numUnits in reference message to advance to a new location in the reference message. This command effectively excludes a portion of information in the reference message from being included in the intended message.

ADD (data): Add the indicated data to the intended message. This command effectively adds a portion of information, e.g., not present in the reference message, to the intended message.

SET2: Intended message initialized as an empty message; command primitives instruct sequential generation of intended message assuming random access of reference message COPY (offset, numUnits) or COPY (offsetStart, offsetEnd): Copy numUnits starting at the location indicated by offset (or copy the information bounded by offsetStart and offsetEnd) from the reference message to the intended message. This command effectively copies a portion of information from the reference message to the intended message.

ADD (data): Add the indicated data to the intended message. This command effectively adds a portion of information, e.g., not present in the reference message, to the intended message.

SET3: Intended message initialized as equal to reference message; command primitives instruct modification of intended message assuming random access of intended message DELETE (offset, numUnits) or DELETE (offsetStart, offsetEnd): Delete numUnits starting at the location indicated by offset (or delete the information bounded by offsetStart and offsetEnd) from the intended message. This command effectively excludes a portion of information in the reference message from being included in the intended message.

INSERT (offset, data): Insert the indicated data in the intended message at the location indicated by offset. This command effectively adds a portion of information, e.g., not present in the reference message, to the intended message.

In each of the command primitive sets above, additional higher level commands may be added to more efficiently encode particular differences between the reference message and the intended message. The following additional commands can be used to extend the functionality of SET3.

REPLACE (offset, numUnits, data) or REPLACE (offsetStart, offsetEnd, data): Replace numUnits starting at the location indicated by offset (or replace the information bounded by offsetStart and offsetEnd) in the intended message with the indicated data. This command effectively replaces a portion of information from the reference message with a different portion of information in the intended message. It can be viewed as application of both a DELETE and an INSERT at the same location.

OVERWRITE (offset, data): Overwrite the current content of the intended message starting at the location indicated by offset with the indicated data. This command effectively replaces a portion of information from the reference message with a different portion of information of the same size in the intended message. It can be viewed as application of both a DELETE and an INSERT at the same location where the deleted and inserted information are of the same size. It can also be viewed as a special case of REPLACE where the information being replaced and the replacement information are of the same size.

UINT_INCREMENT (offset, numUnits) or UINT_INCREMENT (offsetStart, offsetEnd): Treat the information corresponding to numUnits starting at the location indicated by offset (or the information bounded by offsetStart and offsetEnd) as an unsigned integer and increment its value.

Note that in the exemplary commands the interpretation of parameters such as offset and numUnits may vary depending on the embodiment. For example, in one embodiment offset may indicate a location determined as the number of bytes or words from the beginning of the message, while in another embodiment offset may indicate a location determined as the relative number of bytes or words from a current location, e.g., the location at which the last command or operation was performed. Similarly, numUnits may correspond to a number of bits, number of bytes, number of words, etc.

2.4 Exemplary Message Object Format for Commands

In some embodiments a sequence of command primitives is included in a compressed message as a sequence of message objects.

2.4.1 Generic Command Message Object Format

FIG. 15 presents an exemplary generic message object format for commands. Where:

Command: Indicates the particular command, e.g., DELETE, INSERT, REPLACE, OVERWRITE, etc.

Length: Indicates the total length of the command message object in bytes.

Command Dependent Info: Includes one or more additional fields that provide parameters and/or data pertaining to the particular command, e.g., offset and numUnits for a DELETE command, or offset and data for an INSERT command.

2.4.2 SET3 Command Message Object Formats

The following presents exemplary message object formats for the commands previously defined in SET3.

See FIG. 16 for DELETE Message Object Format
Where:
Command: 1 (DELETE)
Length: 6
Offset: Indicates a location determined as the number of bytes from the beginning of the message, e.g., value 0 indicates the beginning of the message and value 1 indicates after the first byte.
NumUnits: Indicates the number of bytes to be deleted beginning with the first byte following the offset location.

See FIG. 17 for INSERT Message Object Format
Where:
Command: 2 (INSERT)
Length: Variable
Offset: Indicates a location determined as the number of bytes from the beginning of the message, e.g., value 0 indicates the beginning of the message and value 1 indicates after the first byte.
Data: Indicates the data to be inserted at the indicated offset location.

See FIG. 18 for REPLACE Message Object Format
Where:
Command: 3 (REPLACE)
Length: Variable
Offset: Indicates a location determined as the number of bytes from the beginning of the message, e.g., value 0 indicates the beginning of the message and value 1 indicates after the first byte.

NumUnits: Indicates the number of bytes to be deleted beginning with the first byte following the offset location.

Data: Indicates the data to be inserted at the indicated offset location.

See FIG. 19 for OVERWRITE Message Object Format
Where:
Command: 4 (OVERWRITE)
Length: Variable
Offset: Indicates a location determined as the number of bytes from the beginning of the message, e.g., value 0 indicates the beginning of the message and value 1 indicates after the first byte.
Data: Indicates the data to be used for overwriting the data that begins with the first byte following the offset location.

See FIG. 20 for UINT_INCREMENT Message Object Format
Where:
Command: 5 (UINT_INCREMENT)
Length: 6
Offset: Indicates a location determined as the number of bytes from the beginning of the message, e.g., value 0 indicates the beginning of the message and value 1 indicates after the first byte.
NumUnits: Indicates the number of bytes beginning with the first byte following the offset location to be treated as an unsigned integer value and incremented.

2.5 Exemplary Application to Mobile IP Message

The following illustrates an exemplary application of an exemplary embodiment using the SET3 commands to a Mobile IP version 4 (MIPv4) message. A MIPv4 Registration Request message has the following format.

See FIG. 21 for MIPv4 Registration Request Message Format

Assuming that a subsequent registration message differs from the previous registration request only by the value of the identification field, e.g., a registration renewal via the same Care-of Address, the following represents an exemplary compressed version of the subsequent registration message.

See FIG. 22 for Compressed MIPv4 Registration Request Message Object Format
Where:
Type: A new MIPv4 message type value indicating a compressed message including a sequence of SET3 commands.
Command: 4 (OVERWRITE)
Length: 13
Offset: 16
Data: The value of the Identification Field in the subsequent "intended" registration request message.

Alternative Compressed MIPv4 Registration Request Message Object Format

The following is the hexadecimal representation of a first Mobile IPv4 registration request message header.

01 02 0e 10 0a 01 89 74 0a 01 80 01 0a 01 80 f5 c8 c5 7e 2a 00 01 00 00 20 14 00 00 01 00 ba e7 b2 5c f2 00 3d8f 45 3f a6 26 32 02 27 90

The following is the hexadecimal representation of a subsequent second Mobile IPv4 registration request message header for the purpose of refresh.

01 02 0e 10 0a 01 89 74 0a 01 80 01 0a 01 80 f5 c8 c5 7e 34 00 02 00 00 20 14 00 00 01 00 e6 21 60 13 b3 3e 7f a8 4f ac 0f 6d 78 83 28 9a

The message shown in FIG. 23 is an exemplary compressed representation of the second message according to an exemplary embodiment.
Where Type identifies a compressed registration request
Home Address identifies the mobiles from which the registration request is originated CompID is the compression ID identifying the reference message
The exemplary message includes two command extensions with corresponding Length, offset and data fields.

3. MIP Specific Compression

The Mobile IP protocol has been extended with a lot of features over time. Such additional features include extensions for prefix registration, extension for IPv6 and IPv4 prefixes, host configuration, hierarchical registrations, network access identifiers and many others. In parallel, Mobile IP is now being used over different technologies, including wireless technologies and technologies with limited bandwidth. The proliferation of extensions coupled with the use of Mobile IP over low bandwidth links makes a compelling argument for mechanisms that stream-line Mobile IP signaling.

According to some exemplary embodiments a streamlined version of Mobile IP registration/binding messages is defined that is simplified to the minimum necessary for re-registration. Various embodiments also handle delta changes. Various embodiments are applicable to both MIPv4 and MIPv6 while in the MIPv4 case also supports compression between Mobile Node (MN) and Foreign Agent (FA) while FA to Home Agent (HA) signaling can be uncompressed. Alternatively, MN to FA signaling can be uncompressed while FA to HA signaling can be compressed.

Mobile IP compression according to various embodiments is based on the knowledge of the message structure of Mobile IP messages. In one embodiment the initial Mobile IP registration is completed using full Mobile IP messages as defined in the various Mobile IP related specifications.

Subsequent registrations, however, include only the parameters that are necessary for registration refresh or to indicate registration changes. This is possible since most of the Mobile IP features are typically negotiated up front and then they typically do not change. While some changes can be implemented using the compression mechanism defined here, it is always possible to perform a full registration at any time to request changes that may not be efficient using the compressed messages.

Depending on the purpose of the compressed registration different parameters may need to be included.

Figure 3:
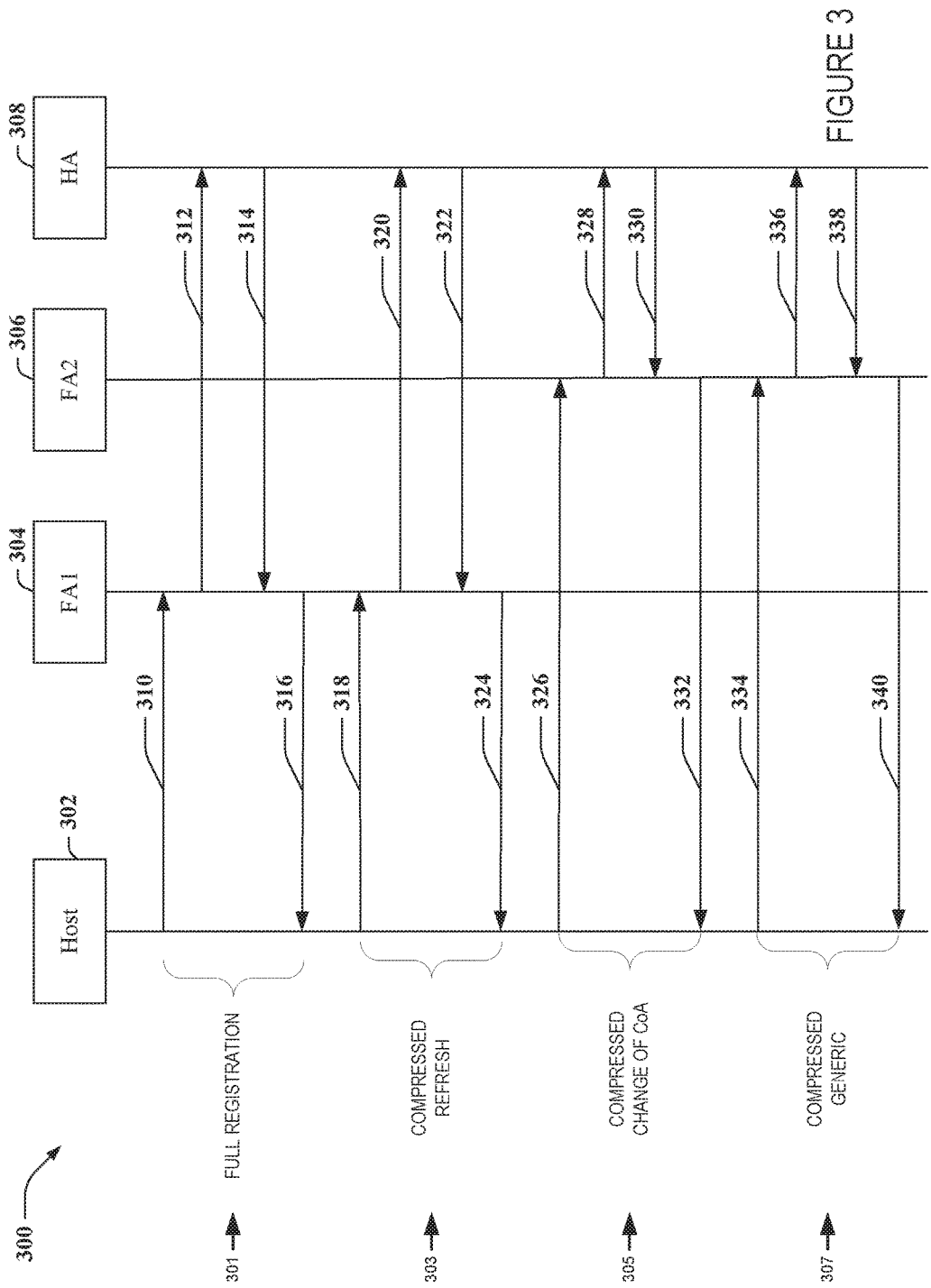
FIG. 3 is a drawing including a host node, a first foreign agent node (FA 1), a second foreign agent node (FA 2), a Home Agent (HA) node, and exemplary signaling in accordance with various embodiments.

FIG. 3 is a drawing 300 including a host node 302, a first foreign agent node (FA 1) 304, a second foreign agent node (FA 2) 306, a Home Agent (HA) node 308, and exemplary signaling in accordance with various embodiments. The Host node 302 is, e.g., a wireless terminal such as a mobile node, while FA 1 304, FA 2 306 and HA 308, are, e.g., base stations and other network nodes. In FIG. 3 a Host 302 first performs an exemplary registration 301 using standard mobile IP messages, sometimes referred to as a Full Registration. This exchange including messages 310, 312, 314 and 316 provides the mobile 302, FA 304 and HA 308 with the compression context. Alternatively the compression context can be stored in the mobile 302, FA 304 and HA 308 in advance. Since the Mobile IP message structure is known, default values for the different fields can be defined as default context. The compressed messages are then sent as deltas to such default full registration messages.

The Host 302 then performs a Compressed Refresh registration 303, including compressed messages 318, 320, 322, 324, in which the compressed messages are limited to the fields required to perform a refresh with no change to any other aspect of the binding being sent. Note that in some cases refresh registration can be the most typical registration performed.

Then the Host performs a Compressed Change of Care-off Address (CoA) registration 305 including messages 326, 328, 330, 332. This registration changes the registered CoA and refreshes the binding without any other changes. This is also typically a common type of registration which is performed when the host moves between subnets; in the example of FIG. 3 the host moves from FA1 304 to FA2 306, which requires a change of CoA registration.

Next, the host performs a compressed Generic Registration 307 including messages 334, 336, 338 and 340, in which it refreshes the binding, optionally changes the CoA and request an additional change to its registration by including a Mobile IP extension.

The following sections describe in more detail the nature of the compressed refresh, change of CoA and generic registration messages.

3.1 Refresh Registration

A refresh registration aims to refresh the lifetime of the agreed state i.e, the state negotiated during the last registration. In this type of registration the MN needs to at least identify itself. In an instance of the embodiment the parameters included in the messages are as follows:
Compressed Request
IP Header
UDP Header
Compressed Registration Request Header
Identification field
MN Identifier field e.g., HoA or NAI
Authenticator field
Compressed Reply
IP Header
UDP Header
Compressed Registration Request Header
Identification field
Status (Success/Failure)
Authenticator field If the signaling is between the MN and the FA, the IP and UDP headers may not be included in some instances of various embodiments. In one instance, the compressed messages can be identified to the receiver by using a designated port number. Alternatively, the compressed messages can be identified by using the Mobile IP port number, in which case they include a type field indicating the type of compressed message. Note that additional parameters may be included. For example the MN may include a mobile-foreign authenticator.

3.2 Change of CoA Registration

A change of CoA registration aims to refresh the lifetime of the agreed state, e.g., the state negotiated during the last registration and to change the care-off address of the mobility binding held by the HA. In this type of registration the MN should at least identify itself and in some cases the MN should also identify the new CoA. The parameters included in the messages are as follows:
Compressed Request
IP Header
UDP Header
Compressed Registration Request Header
Identification field
MN Identifier field e.g., HoA or NAI
New Care-off Address
  Required if sent directly to the HA
  Optional if sent via a foreign agent
Authenticator field
Compressed Reply
IP Header
UDP Header
Compressed Registration Request Header
Identification field
Status (Success/Failure)
Authenticator field If the signaling is between the MN and the FA, the IP and UDP headers may not be included in some instances of some embodiments. In one instance, the compressed messages can be identified to the receiver by using a designated port number. Alternatively, the compressed messages can be identified by using the Mobile IP port number, in which case they include a type field indicating the type of compressed message. Note that additional parameters may be included but are not necessary. For example the MN may include a mobile-foreign authenticator.

When the registration is sent via a foreign agent it is possible not to include the new care-off address. Instead the foreign agent may include the care-off address to be used in an extension field. In other cases the mobile includes the care-off address field in the compressed registration.

3.3 General Modification Registration

A general modification registration aims to refresh any of the parameters typically associated with Mobile IP extensions. This type of registration will take the form of a refresh or a change in CoA registration with the addition of one or more extension corresponding to the requested modification.

This type of registration works because typically Mobile IP extensions are self contained and include most of the information required for the feature they are designed to provide in the extensions themselves. A number of such features can be implemented with the compressed registration defined here.

3.4 The Compression ID

It is possible to use a compression ID during a compressed registration to identify the last successful registration transaction. This is useful if the mobile has to send a $2^{nd}$ registration while it has not yet received the registration reply message for the $1^{st}$ registration. If the first registration was a "Refresh" or "Change of CoA" registration, this mechanism is not necessary. If, however, the $1^{st}$ registration was a "General Modification" registration, the $2^{nd}$ registration should indicate whether the "last successful registration" from the perspective of the MN was the $1^{st}$ registration or a previous one. If it is the $1^{st}$ registration but the HA has not received that request then the request will be rejected and the mobile can register with full registration or combine the changes introduced in the $1^{st}$ and $2^{nd}$ registration in the $3^{rd}$ registration.

In some instances the compression ID is used in combination with the generic compression mechanism and in some other instances it is used in combination with the Mobile IP specific compression mechanism.

3.5 Compressed Mobile IPv4 Exemplary Implementation

This section sets forth one exemplary implementation of Mobile IPv4 Compression mechanisms. Other similar implementations can be designed by persons skilled in the art.

3.5.1 Example Extensions to Standard MIP Messages

In one implementation the mobile first performs a full MIP registration with its HA and includes the Compression Capability Extension shown in FIG. 24:
Type: Indicates Compression Capability
Length: indicates the length of the extension Flags: C indicates that the mobile intends to used the Compression ID Reserved: Reserved for future use If the FA also supports compression it also includes another copy of the extension in the registration. In MIP depending on where the extension is placed in relation to the various authentication headers, one can recognize which entity included said extension.

If an FA is in the path and the HA does not see a compression capability extension included by the FA the HA should ignore the compression capability extension included by the MN. If the HA does not support the compression feature then it will ignore all such extensions. If the HA supports compression then it will include the compression capability extension in the registration reply.

Note that the HA can indicate that the Compression ID is not to be used even if the mobile has requested its use. In some instances the HA does not require the use of the compression ID if the mobile does not request it.

3.5.2 Example Compressed Request/Reply Formats

A Compressed Registration message may look as shown in FIG. 25

Alternative is shown in FIG. 26:

Where:
Type: Indicates Compressed Registration
Flags: A-E indicate the presence of fields (A)-(E)
Res: Reserved for future use
Fields (A)-(E), when present, are identical to the fields described in RFC3344
If field (B) i.e., Home Address, is not included then either the Mobile Identifier field (F) or the NAI extension should be included
(F) Mobile Identifier is an identifier other than the home address. In some system, e.g., when overlapping address spaces are used, the HoA Address does not uniquely identify the mobile. Instead the HoA and the HA together identify the mobile or the HoA and some other parameter like the GRE Tag. The Mobile Identifier is a different way of again uniquely identifying the mobile in a compressed registration.
Field (G), CompressionID is an optional field that identifies the last registration.

A Compressed Reply message may look as shown in FIG. 27

Where:
Type: Indicates Compressed Reply
Code: As defined in RFC3344
The rest of the fields, are the same as or similar to the fields described in RFC3344

Any authenticators included in the compressed messages can be calculated over the compressed messages themselves. A mobile-home authentication extension, for example, would, in some embodiments, include an authenticator field which is calculated according to Mobile IP specifications over the Compressed Mobile IP header and all the extensions, including the Type and Length fields of the authentication extension.

3.6 MIP Specific MN to FA Compression

It is possible to compress Mobile IP signaling between a MN and a FA, while signaling between the FA and the HA remains uncompressed and according to the Mobile IP standard.

For this type of compression the MN first construct the full Mobile IP registration that it would have sent without compression. Then, compressible fields, are removed from the message and the message is send to the FA. The FA recreates the original message by adding the fields removed by the MN, as well as any of its own extension and sends the message to the HA.

The format of the compressed registration could be identical to the compressed registration shown above. There are, however, two differences:

Between the MN and the FA the IP and UDP can be completely removed. Instead the message can be transported directly over the link between MN and FA, In one instance the compressed messages use a designated protocol type over that link layer.

The authenticator included by the MN is calculated over the original Mobile IP header and not the compressed one. This is because the FA will have to recreate and send the original MIP message and the HA will have to check the MN-HA authenticator over the received messages, which is not going to be compressed.

3.7 Alternative Compressed M IPv4 Registration Request Message Object Format

The following is the hexadecimal representation of a first Mobile IPv4 registration request message header.

01 02 0e 10 0a 01 89 74 0a 01 80 01 0a 01 80 f5 c8 c5 7e 2a 00 01 00 00 20 14 00 00 01 00 ba e7 b2 5c f2 00 3d8f 45 3f a6 26 32 02 27 90

The following is the hexadecimal representation of a subsequent second Mobile IPv4 registration request message header for the purpose of refresh.

01 02 0e 10 0a 01 89 74 0a 01 80 01 0a 01 80 f5 c8 c5 7e 34 00 02 00 00 20 14 00 00 01 00 e6 21 60 13 b3 3e 7f a8 4f ac af 6d 78 83 28 9a

The message shown in FIG. 28 is an exemplary compressed representation of the second message according to an exemplary embodiment.

3.8 Mobile IPv6 Message Compression

Mobile IPv6 messages (RFC3775) are sent in an IPv6 extension header called the Mobility Header (MH). The MH allows several types of messages to be sent, including Binding Update message (BU), which is sent by the mobile node and is used to manipulate the routing of packets at the receiver. This message is sent by hosts and routers to manage their mobility, in addition to the network attached to them (in the case of mobile routers). Extensions are added to, e.g., the BU message, in the form of additional options. Hence, a BU message may, and sometimes does, contain a large number of bytes that are sent over a wireless or wired link. To avoid sending large BU messages, in various embodiments a new option is included that indicates to the receiver of the BU that at least some of the previous parameters in the last accepted BU are still valid in the new message. The new option is sometimes called the Compressed Mobility Update option (CMU). This option can be included in the BU message itself or in any other message in the MH. The CMU option can also be used in the initial BU message to negotiate with the receiver whether compression is supported.

3.8.1. The CMU Option

The CMU option is shown in FIG. 29.

Where:
Type Indicates the option Type
Length Indicates the option length
C Indicates that the Care-of Address (CoA) in the previous message is still valid.
A Indicates an "Add" operation. When this flag is set, the new BU message contains new options that need to be added (not replace) the current cache entry. However, some of these options may, due to MIPv6 processing, replace or update existing information. The flag indicates to the receiver that the entire cache entry should not be automatically be replaced with the information in this new message.

N This field indicates a request to use compression. This field is used in the first message sent and the receiver would reply, if compression is supported, by sending back the same option in its acknowledgement, If compression is not supported this option is ignored.

CID Indicates the Compression Id field. In one instance this field is different in each message. This can be done by monotonically incrementing this field every time a message is sent. Alternatively, a timestamp or a combination of timestamp and counter could be used.

3.8.2 Operation of the Compression Mechanism

When the Mobile Node (MN) sends the initial mobility update message, e.g. a BU, it contains the CMU option with the N flag set and a full uncompressed message including the desired options. The receiver of the message, either a Home Agent (HA) or a Correspondent Node (CN) processes the message as usual. It then processes the CMU option; if compression is supported, it responds with the relevant acknowledgement message, e.g. a Binding Acknowledgement (BA), and includes the CMU option it received.

When the sender receives the acknowledgement message with the CMU option, it knows that compression is supported at the other end. Therefore, from this point onwards, future mobility update messages would be compressed.

If the sender needed to send a mobility update identical to the previous one, it only includes the information necessary to recognize the message, in addition to the CMU option. For the BU message, this implies including the BU and the CMU option. In one instance, if the CoA had not changed and the BU was sent with the alternate CoA option, the C flag in the CMU message is set and the alternate CoA option is removed from the message. This indicates to the receiver that it should use the last CoA.

3.8.2.1 Sending Additional Information in a Compressed Message

At any time, a MN may wish to add more information encoded as options in its mobility update messages. This can be done without sending the full uncompressed message. To do this, the MN includes the new options in its mobility update message. In one instance, the message includes the new options. In addition, the message contains the CMU option, with the A flag set. This indicates to the receiver that the new options included in this message are to be added to the existing cache and that the new mobility update message should not be treated as a new uncompressed message. Some of the new options may modify states in the existing cache, this is done per usual MIPv6 processing. The A flag simply indicates that the message is not an uncompressed update and that new information is to be added to the original message.

In one instance after processing such message and acknowledging it, the sender should assume that the new information is stored in addition to the original one. Therefore, future mobility updates need not include those recent options but will include the CMU option.

3.8.2.2 Loss of Synchronization Between a Compressor and a Decompressor

At anytime, the receiver of the mobility update (e.g. a BU) may have lost the original uncompressed message. Therefore, if it receives a new compressed message, it needs to indicate to the sender that the message cannot be processed. This may be done by sending an acknowledgement message with the relevant error code, e.g. "compressor state lost".

When the sender receives this error code it should send the original uncompressed message and include the CMU option with the N flag set, to indicate a request for using compression in future messages.

3.8.3 Compression without the CMU Option

An alternative to data compression within mobility signaling can be achieved without using the CMU option in every message. This mechanism relies on a similar approach to that presented earlier for MIPv4. In this approach, compression negotiation happens initially between the sender and the receiver using the CMU option as discussed above. However, the compressed messages use new message types or option types, e.g. for the BU, that are reserved for compressed messages. Using this mechanism the receiver understands that it is receiving compressed messages and acts as described earlier in this document.

Figure 4:
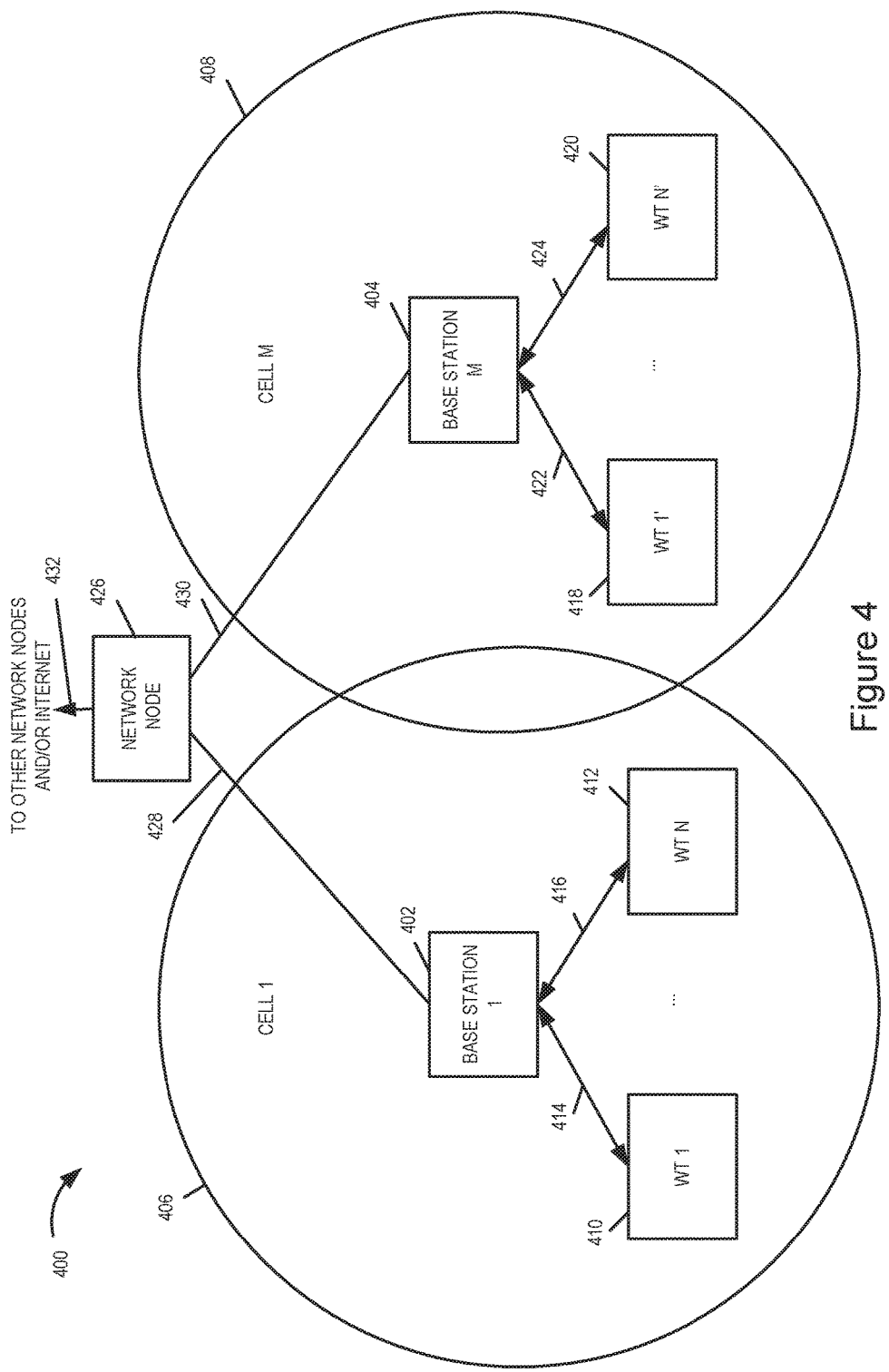
FIG. 4 is drawing of an exemplary wireless communications system implemented in accordance with various embodiments.

FIG. 4 illustrates an exemplary communications system 400 implemented in accordance with various embodiments. For example, exemplary communications system 400 may be an orthogonal frequency division multiplexing (OFDM) multiple access wireless communications system. Exemplary system 400 includes a plurality of base stations (base station 1 402, . . . , base station M 404) each with a corresponding wireless coverage area (cell 1 406, . . . , cell M 408) respectively. System 400 also includes network node 426 coupled to base stations (402, 404) via network link (428, 430), respectively. Network node 426 is also coupled to other network nodes and/or the Internet via network link 432. Network links (428, 430, 432) are, e.g., fiber optic links. Exemplary system 400 also includes a plurality of wireless terminals, e.g., mobile nodes. In the system 400, wireless terminal (WT 1 410, . . . , WT N 412) are coupled to base station 1 402 via wireless links (414, . . . , 416), respectively; wireless terminal (WT 1' 418', . . . , WT N' 420) are coupled to base station M 404 via wireless links (422, . . . , 424), respectively. The wireless terminals, e.g., mobile nodes, and base stations exchange messages, e.g., compressed messages, which are generated, implemented and processed in accordance with features of various embodiments. Each wireless terminal, e.g., mobile terminal, may correspond to a different mobile user and are therefore sometimes referred to as user terminals. The signals communicated over the wireless links (414, 416, 422, 424) may be, e.g., OFDM signals. The base stations 402, 404 and wireless terminals 410, 412, 418, 420 implement methods. Signals communicated via wireless links (414, 416, 422, 424) include compressed messages and/or signals of the type discussed in this application.

In some embodiments, a communication system includes a single base station and a plurality of wireless terminals and at least some compressed messages, e.g., compressed mobility messages, are communicated over the airlink. In some embodiments, at least some of the base stations are multi-sector base stations. In some embodiments, some of the communications devices in the system, e.g., at least one base station and at least one wireless terminal supports compressed messages, while at least some other communications devices in the system may not support the compressed message features. In some embodiments, at least some communication devices, e.g., at least one base station or at least one wireless terminal, supports a plurality of different protocols with compressed message functionality, e.g., IP version 4 based compressed message features and IP version 6 based compressed message features.

Figure 5:
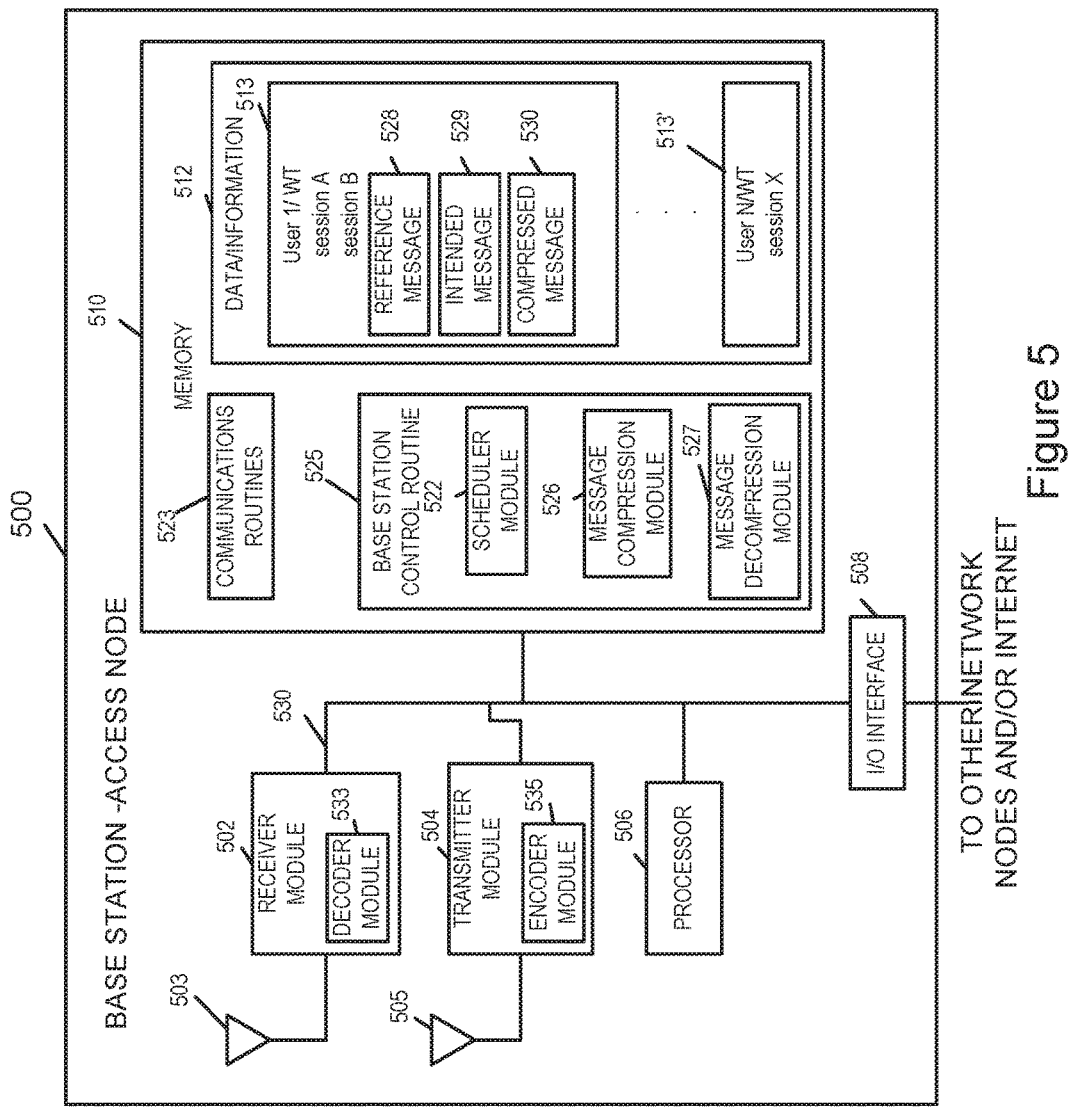
FIG. 5 is a drawing of an exemplary base station, implemented in accordance with various embodiments.

FIG. 5 illustrates an exemplary access node, e.g., base station, 500 implemented in accordance with various embodiments. Exemplary base station 500 may be any of the base stations of system 400 of FIG. 4. The base station 500 includes antennas 503, 505 and receiver transmitter modules 502, 504. The receiver module 502 includes a decoder module 533 while the transmitter module 504 includes an encoder module 535. The modules 502, 504 are coupled by a bus 530 to an I/O interface 508, processor 506, e.g., CPU, and memory 510. The I/O interface 508 couples the base station 500 to other network nodes and/or the Internet. The memory 510 includes routines, which when executed by the processor 506, cause the base station 500 to operate in accordance with various features and/or implement steps of methods. Memory 510 includes communications routines 523 used for controlling the base station 500 to perform various communications operations and implement various communications protocols. The memory 510 also includes a base station control routine 525 used to control the base station 500 to implement the steps of a method or methods, e.g., performing operations such as, e.g., message generation, information recovery, message compression, message decompression and/or signaling. The base station control routine 525 includes a scheduling module 526 used to control transmission scheduling and/or communication resource allocation. Thus, module 526 may serve as a scheduler. The base station control routine 525 also includes a message compression module 526 and a message decompression module 527. Message compression module 526 uses stored reference message information and intended information to convey to generate compressed messages, e.g., compressed mobile IP messages, for transmission via transmitter module 504. Message decompression module 527 recovers intended message information using stored reference message information and a received compressed message. Memory 510 also includes data/information 512 used by communications routines 523 and control routine 525. The data/information 512 includes an entry for each active wireless terminal user 513, 513' which lists the active sessions being conducted by the user and includes information identifying the wireless terminal being used by a user to conduct the sessions. Exemplary data/information 513 includes a reference message 528, an intended message 529 and a compressed message 530. There may be, and sometimes are, multiple sets of reference message information, intended message information, and compressed message information for a wireless terminal, e.g., a first set corresponding to a first compressed message generated and transmitted by base station 500 and a second set corresponding to a second compressed message received and processed by base station 500.

Servers and/or host devices may be implemented using circuitry which is the same as, or similar to, the circuitry of the exemplary base station 500 shown in FIG. 5 but with interfaces and/or control routines suited to the particular server/host device's requirements. The control routines and/or hardware in such servers and/or hosts cause the devices to implement methods.

Figure 6:
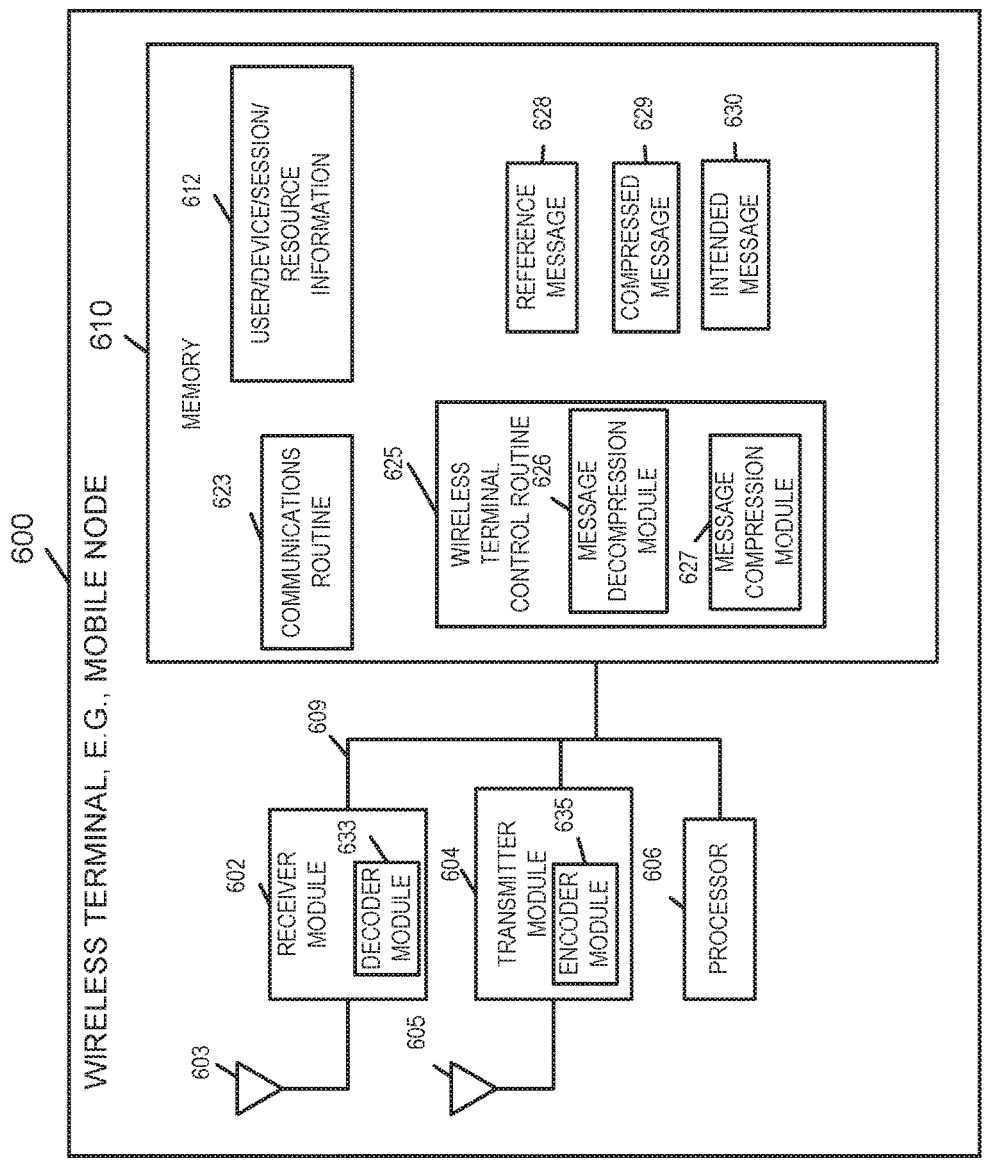
FIG. 6 is a drawing of an exemplary wireless terminal such as a mobile node, implemented in accordance with various embodiments.

FIG. 6 illustrates an exemplary wireless terminal 600, e.g., mobile node, implemented in accordance with various embodiments. Exemplary wireless terminal 600 may be any of the exemplary wireless terminals of system 400 of FIG. 4. The wireless terminal 600, e.g., mobile node, may be used as a mobile terminal (MT). The wireless terminal 600 includes receiver and transmitter antennas 603, 605 which are coupled to receiver and transmitter modules 602, 604 respectively. The receiver module 602 includes a decoder module 633 while the transmitter module 604 includes an encoder module 635. The receiver transmitter modules, e.g., circuits, 602, 604 are coupled by a bus 609 to a memory 610.

Processor 606, under control of one or more routines stored in memory 610 causes the wireless terminal 600, e.g., mobile node, to operate in accordance with the methods in accordance with various features. In order to control wireless terminal operation memory 610 includes communications routine 623 and wireless terminal control routine 625.

Wireless terminal control routine 625 includes a message decompression module 626 and a message compression module 627. Message compression module 627 uses stored reference message information and intended information to convey to generate compressed messages, e.g., compressed mobile IP messages, for transmission via transmitter module 604. Message decompression module 626 recovers intended message information using stored reference message information and a received compressed message. The wireless terminal control routine 625 is responsible for insuring that the wireless terminal operates in accordance with an implemented method or methods and performs the method's steps in regard to wireless terminal operations. The memory 610 also includes user/device/session/resource information 612 which may be accessed and used to implement the methods and/or data structures used to implement various features and/or steps. Memory 610 also includes a reference message 628, a compressed message 629 and an intended message 630. There may be, and sometimes are, multiple sets of reference message information, intended message information, and compressed message information in memory 610, e.g., a first set corresponding to a first compressed message generated and transmitted by wireless terminal 600 and a second set corresponding to a second compressed message received and processed by wireless terminal 600.

Figure 7:
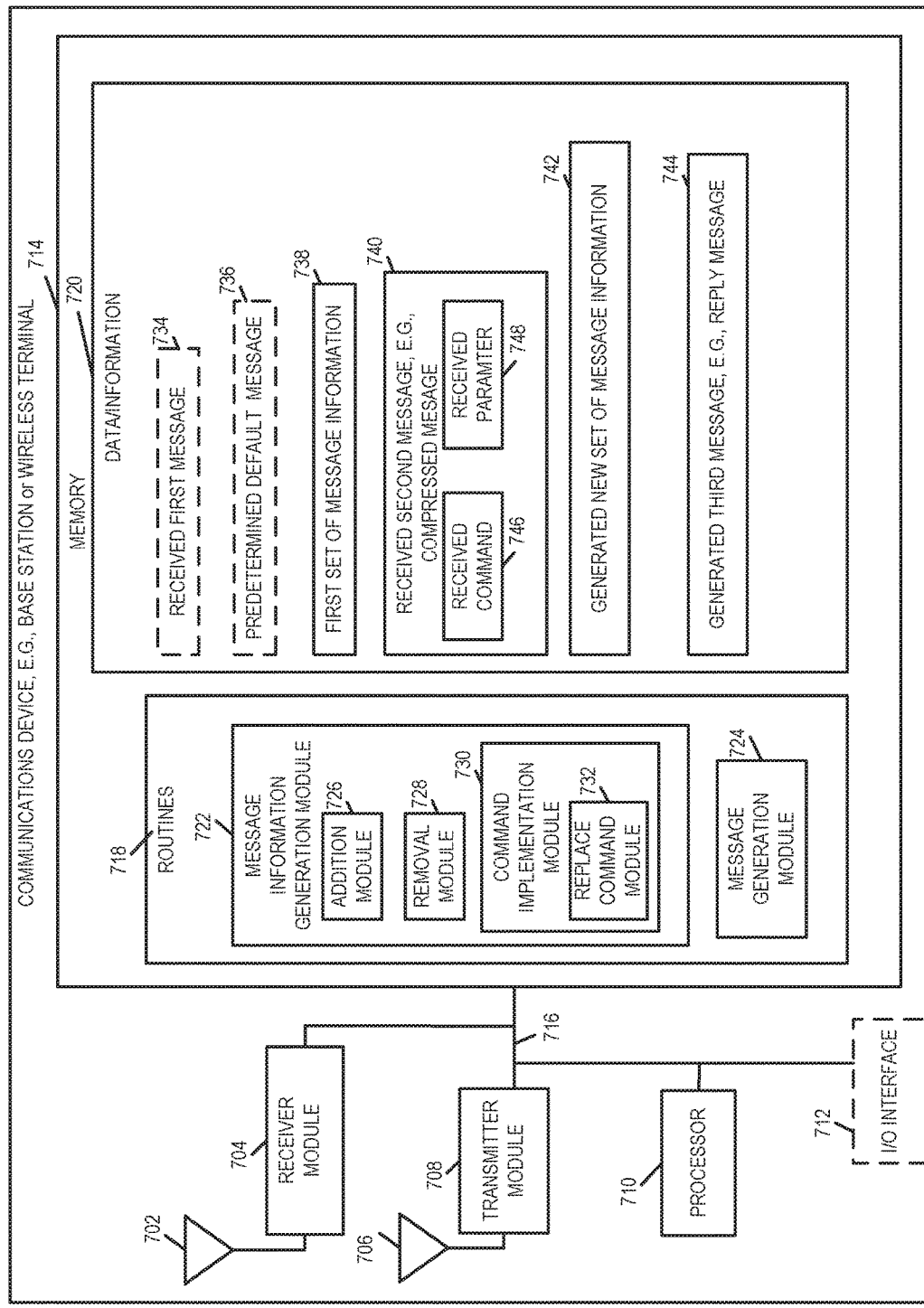
FIG. 7 is a drawing of an exemplary communications device implemented in accordance with various embodiments.

FIG. 7 is a drawing of an exemplary communications device 700, e.g., a base station or a wireless terminal such as a mobile node, in accordance with various embodiments. Exemplary communications device 700 may be any of the exemplary base stations or wireless terminals of system 400 of FIG. 4. Exemplary communications device 700 includes a receiver module 704, a transmitter module 708, a processor 710, and a memory 714 coupled together via a bus 716 over which the various elements may interchange data and information. In some embodiments, e.g., embodiments where the communications device 700 is a base station, the communications device 700 also includes an I/O interface 712 coupled to bus 716.

Memory 714 includes routines 718 and data/information 720. The processor 710, e.g., a CPU, executes the routines 718 and uses the data/information 720 in memory 714 to control the operation of the communications device 700 and implement methods.

Receiver module 704, e.g., an OFDM wireless receiver, is coupled to receive antenna 702 via which the communications device 700 receives signals from other communications devices. For example, if communications device 700 is a wireless terminal, communications device 700 receives downlink signals from base stations. Alternatively, if communications device 700 is a base station, communications device 700 receives uplink signals from wireless terminals. Receiver module 704 receives a second message, said second message including at least one command and at least one parameter corresponding to said command.

Transmitter module 708, e.g., an OFDM transmitter, is coupled to transmit antenna 706 via which the communications device transmits signals to other communications devices. For example, if communications device 700 is a wireless terminal, communications device 700 transmits uplink signals to base stations. Alternatively, if communications device 700 is a base station, communications device 700 transmits downlink signals to wireless terminals. In some embodiments, the same antenna is used for transmitter module 708 and receiver module 704.

I/O interface 712 couples the communications device 700 to other network nodes, e.g., other base stations, Home Agent nodes, routers AAA nodes, etc., and/or the Internet. For example, consider that communications device 700 is a base station, I/O interface 712 by coupling the base station 700 to a backhaul network allows a wireless terminal using the base station as its point of network attachment to participate in a communications session with a peer node, e.g., another wireless terminal, using a different base station as its point of network attachment.

Routines 718 include a message information generation module 722 and a message generation module 724. The message information generation module 722 includes an addition module 726, a removal module 728, and a command implementation module 730. Command implementation module 730 includes a replace command module 732.

Message information generation module 722 generates a new set of message information, e.g., information 742, by processing a stored first set of message information, e.g., information 738, in accordance with a command received in a second message, e.g., received command 746. In some embodiments, the first message is a predetermined default message, e.g., message 736. In some embodiments, the first message is a received message, e.g., message 734. Received first message 734 may be and sometimes is an uncompressed message. In some embodiments, the first set of message information, e.g., information 738, includes information generated from the first message, e.g., information generated from one of received first message 734 or predetermined default message 736.

Addition module 726, executed in response to a receive command in a received second message being an ADD command, generates a new set of message information by adding data included in said received parameter from a received second message to a first set of message information to generate a new set of message information. Removal module 728, executed in response to a received command in a received second message being a REMOVE command, removes at least some information indicated to be removed by a received parameter in the received second message, the indicated information to be removed from said first set of message information in generating a new set of message information.

Command implementation module 730 implements various different commands that may be included in received second messages including a replace command. Replace command module 730, executed in response to a received REPLACE command in a received second message, replaces information from the first set of message information with information, e.g., data conveyed by a parameter in the received second message, in generating a new set of message information.

Message generation module 724 generates a third message, e.g., message 744, from a generated new set of message information, e.g., information 742. In some embodiments, the generated third message is a reply to a received second message.

Data/information 720 includes a first set of message information 738, a received second message 740, a generated new set of message information 742, and a generated third message 744. Received second message 740, e.g., a compressed message, includes a received command 746 and a received parameter 748. In some embodiments, data/information 720 includes one or more of received first message 734 and predetermined default message 736.

Received second message 740 is, e.g., a compressed message. Received command 746 is, e.g., one of a plurality of different supported commands, e.g., one of a set of commands including an ADD command, a REMOVE command, and a REPLACE command. Received parameter 748 can be and sometimes is data, e.g., data to be added or data to be removed. Received parameter 748 sometimes indicates a location. In some such embodiments, the received parameter 748 indicates location by at least one of an offset and a size.

Received second message 740, e.g., a compressed message, is an input to message information generation module 722, while generated new set of message information 742 is an output of message information generation module 722. Generated third message, e.g., a reply message to received second message 740, is an output of message generation module 724 and is transmitted by transmitter module 708. In some embodiments, the generated third message 744 is generated from the generated new set of message information 742.

Figure 8:
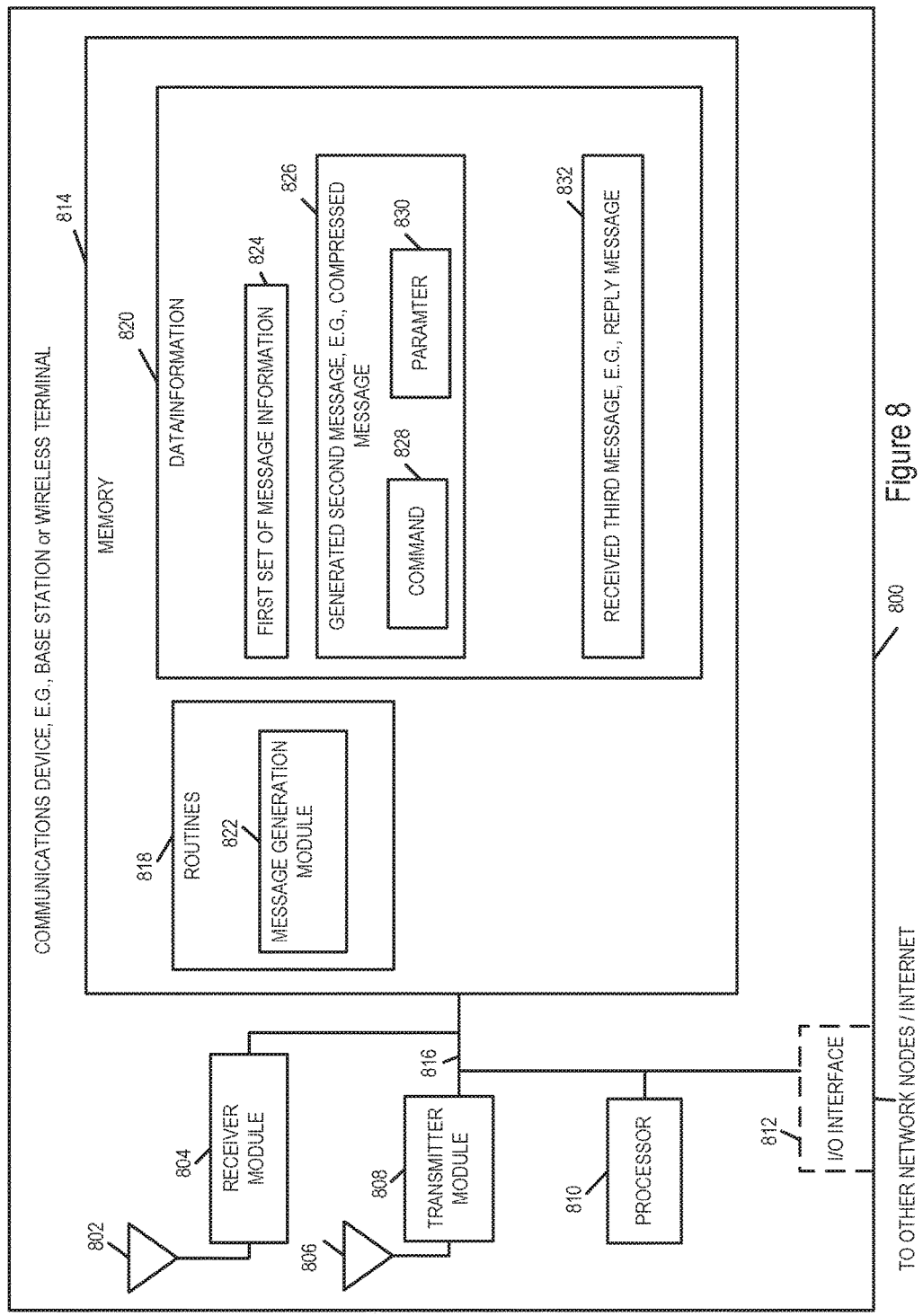
FIG. 8 is a drawing of an exemplary communications device implemented in accordance with various embodiments.

FIG. 8 is a drawing of an exemplary communications device 800, e.g., a base station or a wireless terminal such as a mobile node, in accordance with various embodiments. Exemplary communications device 800 may be any of the exemplary base stations or wireless terminals of system 400 of FIG. 4. Exemplary communications device 800 includes a receiver module 804, a transmitter module 808, a processor 810, and a memory 814 coupled together via a bus 816 over which the various elements may interchange data and information. In some embodiments, e.g., embodiments where the communications device 800 is a base station, the communications device 800 also includes an I/O interface 812 coupled to bus 816.

Memory 814 includes routines 818 and data/information 820. The processor 810, e.g., a CPU, executes the routines 818 and uses the data/information 820 in memory 814 to control the operation of the communications device 800 and implements methods.

Receiver module 804, e.g., an OFDM wireless receiver, is coupled to receive antenna 802 via which the communications device 800 receives signals from other communications devices. For example, if communications device 800 is a wireless terminal, communications device 800 receives downlink signals from base stations. Alternatively, if communications device 800 is a base station, communications device 800 receives uplink signals from wireless terminals.

Transmitter module 808, e.g., an OFDM transmitter, is coupled to transmit antenna 806 via which the communications device transmits signals to other communications devices. For example, if communications device 800 is a wireless terminal, communications device 800 transmits uplink signals to base stations. Alternatively, if communications device 800 is a base station, communications device 800 transmits downlink signals to wireless terminals. In some embodiments, the same antenna is used for transmitter module 808 and receiver module 804. Transmitter module 808 transmits a generated second message, e.g., a compressed message, said second message including at least one command and at least one parameter corresponding to said command.

I/O interface 812 couples the communications device 800 to other network nodes e.g., other base stations, Home Agent nodes, routers AAA nodes, etc., and/or the Internet. For example, consider that communications device 800 is a base station, I/O interface 812 by coupling the base station to a backhaul network allows a wireless terminal using the base station as its point of network attachment to participate in a communications session with a peer node, e.g., another wireless terminal, using a different base station as its point of network attachment.

Routines 818 include a message generation module 822. Message generation module 822 generates a second message, said second message including at least one command and at least one parameter corresponding to said command, said command indicating an operation to be performed on a second set of message information to generate a new set of message information, said second set of message information having the same content as said first set of message information. For example, said second set of message information is, in some embodiments, a local copy of said first set of message information 824, in a communications device receiving wireless signals from communications device 800.

Data/information 820 includes a first set of message information 824, a generated second message 826, and a received third message 832. Generated second message 826, e.g., a compressed message 826, includes a command 828 and a parameter 830.

First set of message information 824 corresponds to a first message. In some embodiments, the first set of message information includes information in said first message. In some embodiments, the first set of message information includes information generated from said first message.

Generated second message 826 is, e.g., a compressed message, is transmitted via transmitter module 808 over an airlink. Generated second message 826 includes a command 828 and a parameter 830. In some embodiments, the second message includes an indicator identifying at least one of the first and second sets of message information, thereby identifying the second set of message information to be used to generate said new set of message information. Command 828 is, e.g., one of a plurality of different supported commands, e.g., one of a set of commands including an ADD command, a REMOVE command, and a REPLACE command. The ADD command indicates that a new set of message information is to be generated by adding data to a second set of message information to generate a new set of message information. The REMOVE command indicates that a new set of message information is to be generated by removing information from said second set of message information. Parameter 830 can be and sometimes is data, e.g., data to be added or data to be removed. Parameter 830 sometimes indicates a location. In some such embodiments, the parameter 830 indicates location by at least one of an offset and a size. In some embodiments, the replace command further includes information indicating information to be replaced in said second set of message information.

Generated second message 826, e.g., a compressed message, is an output of message generation module 822. In some embodiments, the received third message 832 is a reply message to said second message. In various embodiments, the third message was generated, e.g., by another communications device having a wireless link with communications device 800 from a new set of message information, the new set of message information, generated from operations performed on a received second message, the second message having been transmitted by communications device 800.

Figure 9:
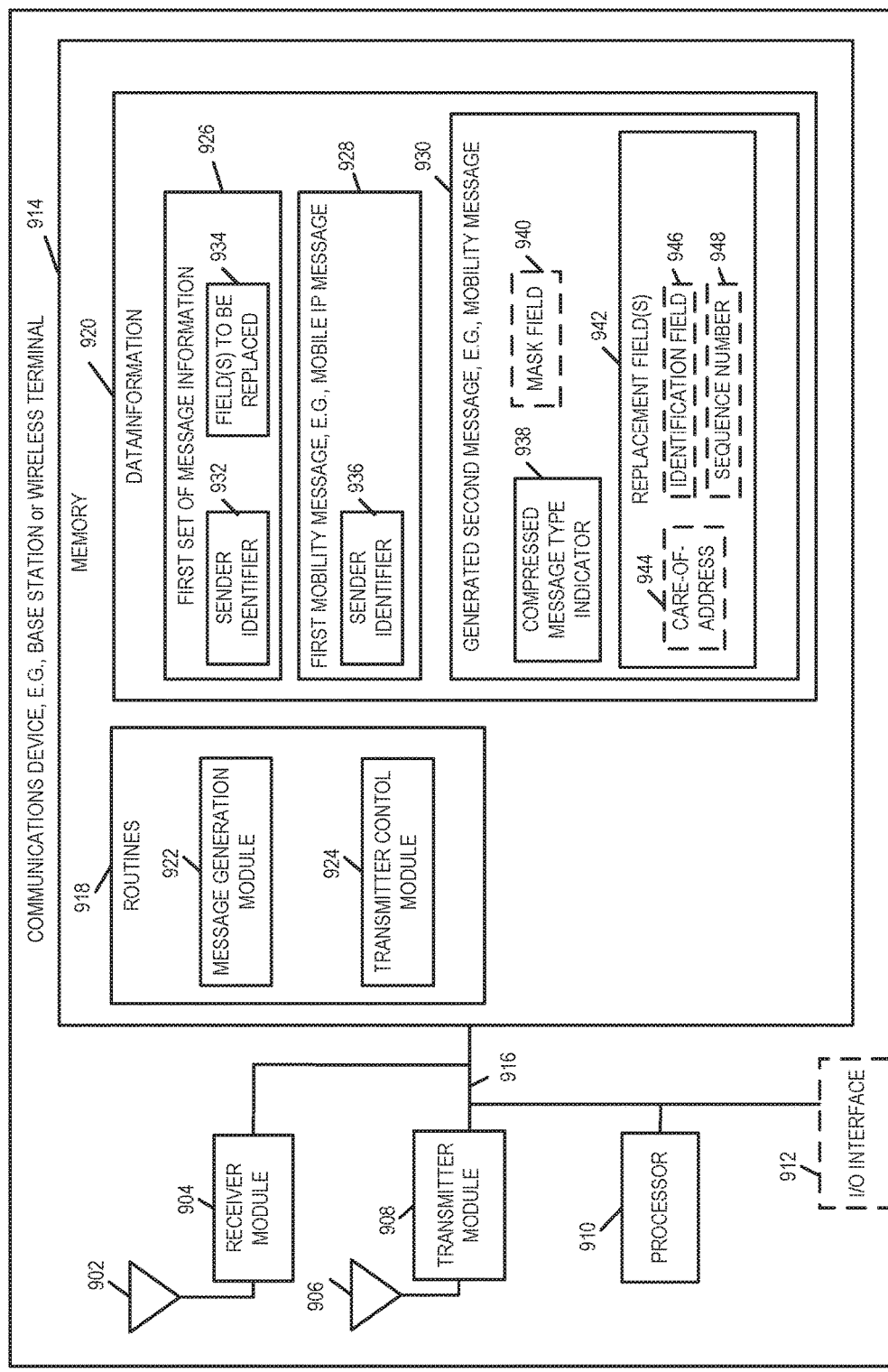
FIG. 9 is a drawing of an exemplary communications device implemented in accordance with various embodiments.

FIG. 9 is a drawing of an exemplary communications device 900, e.g., a base station or a wireless terminal such as a mobile node, in accordance with various embodiments. Exemplary communications device 900 may be any of the exemplary base stations or wireless terminals of system 400 of FIG. 4. Exemplary communications device 900 includes a receiver module 904, a transmitter module 908, a processor 910, and a memory 914 coupled together via a bus 916 over which the various elements may interchange data and information. In some embodiments, e.g., embodiments where the communications device 900 is a base station, the communications device 900 also includes an I/O interface 912 coupled to bus 916.

Memory 914 includes routines 918 and data/information 920. The processor 910, e.g., a CPU, executes the routines 918 and uses the data/information 920 in memory 914 to control the operation of the communications device 900 and implements methods.

Receiver module 904, e.g., an OFDM wireless receiver, is coupled to receive antenna 902 via which the communications device 900 receives signals from other communications devices. For example, if communications device 900 is a wireless terminal, communications device 900 receives downlink signals from base stations. Alternatively, if communications device 900 is a base station, communications device 900 receives uplink signals from wireless terminals.

Transmitter module 908, e.g., an OFDM transmitter, is coupled to transmit antenna 906 via which the communications device transmits signals to other communications devices. For example, if communications device 900 is a wireless terminal, communications device 900 transmits uplink signals to base stations. Alternatively, if communications device 900 is a base station, communications device 900 transmits downlink signals to wireless terminals. In some embodiments, the same antenna is used for transmitter module 908 and receiver module 904. Transmitter module 908 transmits a generated second message, e.g., a generated compressed mobility message over an airlink.

I/O interface 912 couples the communications device 900 to other network nodes, e.g., other base stations, Home Agent nodes, routers AAA nodes, etc., and/or the Internet. For example, consider that communications device 900 is a base station, I/O interface 912 by coupling the base station to a backhaul network allows a wireless terminal using the base station as its point of network attachment to participate in a communications session with a peer node, e.g., another wireless terminal, using a different base station as its point of network attachment.

Routines 918 include a message generation module 922 and a transmitter control module 924. Message generation module 922 generates a second message, said second message including at least a compressed message type indicator and at least one field to replace a corresponding field in a first set of message information. Transmitter control module 924 controls operation of transmitter module 908 including the transmission of a generated second message, e.g., a generated compressed mobility message.

Data/information 920 includes a first set of message information 926, a first mobility message 928 and a generated second message 930. First set of message information 926 includes a sender identifier 932 and one or more fields which can be and sometimes are replaced 934. First mobility message 928, e.g., a mobile IP message, corresponds to first set of message information 926 and includes a sender identifier 936. First set of message information 926 sometimes serves as a reference or baseline when generating a second message, e.g., a compressed message to be transmitted. Generated second message 930, e.g., a mobility message, is an output of message generation module 922 and is transmitted via transmitter module 908 under the control of transmitter control module 924. Generated second message 930 includes a compressed message type indicator 938 and one or more replacement fields 942 corresponding to fields in information 934. In some embodiments, the replacement field or fields 942 includes one or more of a care-of-address 944, an identification field 946 and a sequence number 948. In various embodiments, the generated second message 930 includes a mask field 940.

In some embodiments, for at least some second messages, the compressed message type indicator 938 indicates that the second message is a compressed message which does not include at least one of a Home Agent address, a lifetime, and a Home Address. In some embodiments, for at least some second messages, the second message does not include a mobile IP flag field. In some embodiments, the second message includes mask field 940 which indicates the presence or absence of each field in a set of fields which may be included in the compressed message.

Figure 10:
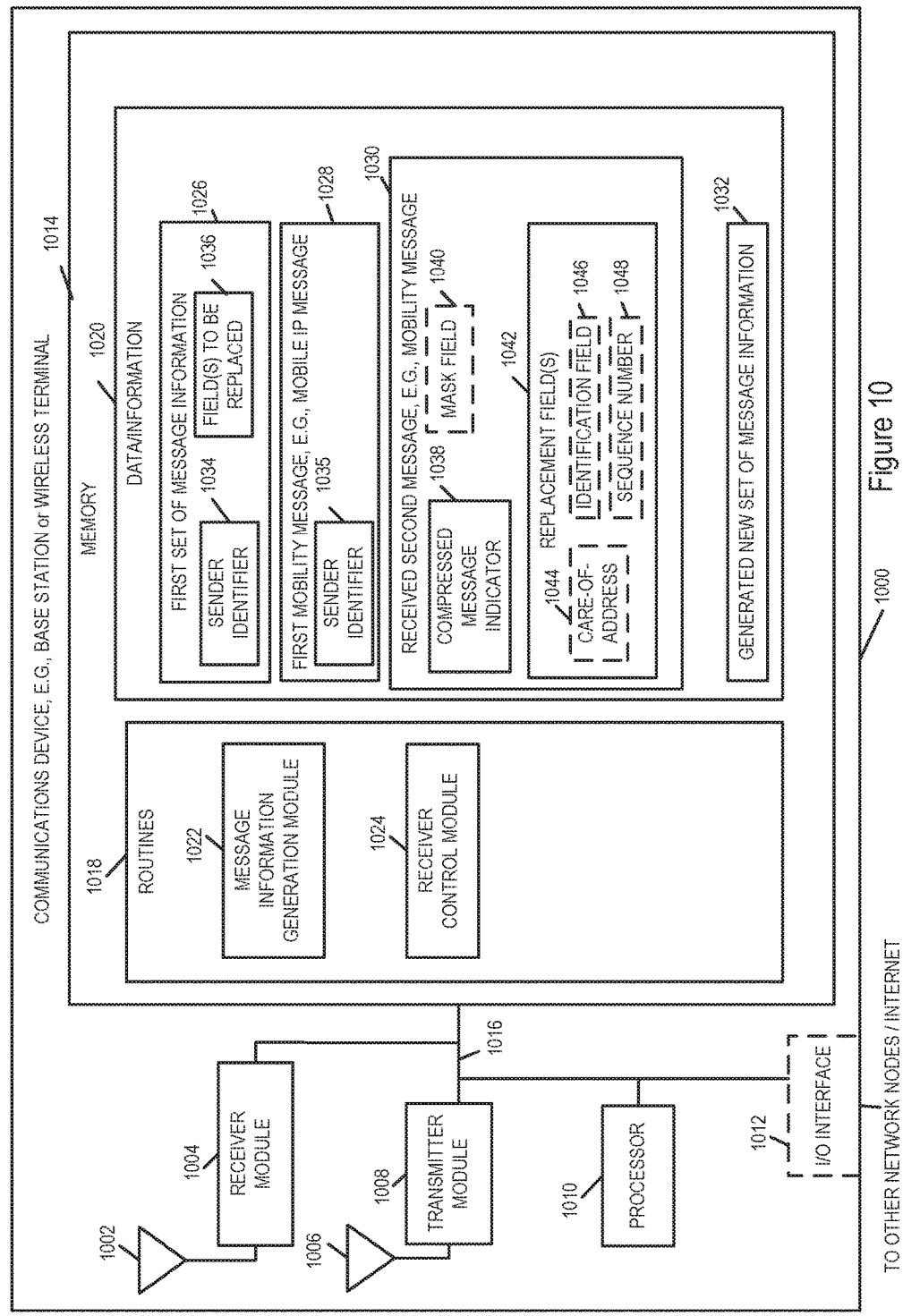
FIG. 10 is a drawing of an exemplary communications device implemented in accordance with various embodiments.

FIG. 10 is a drawing of an exemplary communications device 1000, e.g., a base station or a wireless terminal such as a mobile node, in accordance with various embodiments. Exemplary communications device 1000 may be any of the exemplary base stations or wireless terminals of system 400 of FIG. 4. Exemplary communications device 1000 includes a receiver module 1004, a transmitter module 1008, a processor 1010, and a memory 1014 coupled together via a bus 1016 over which the various elements may interchange data and information. In some embodiments, e.g., embodiments where the communications device 1000 is a base station, the communications device 1000 also includes an I/O interface 1012 coupled to bus 1016.

Memory 1014 includes routines 1018 and data/information 1020. The processor 1010, e.g., a CPU, executes the routines 1018 and uses the data/information 1020 in memory 1014 to control the operation of the communications device 1000 and implements methods.

Receiver module 1004, e.g., an OFDM wireless receiver, is coupled to receive antenna 1002 via which the communications device 1000 receives signals from other communications devices. For example, if communications device 1000 is a wireless terminal, communications device 1000 receives downlink signals from base stations. Alternatively, if communications device 1000 is a base station, communications device 1000 receives uplink signals from wireless terminals. Receiver module 1004 receives, via a wireless communications channel, a second message, said second message including at least a compressed message indicator and at least one field to replace a corresponding field included in a first set of message information.

Transmitter module 1008, e.g., an OFDM transmitter, is coupled to transmit antenna 1006 via which the communications device transmits signals to other communications devices. For example, if communications device 1000 is a wireless terminal, communications device 1000 transmits uplink signals to base stations. Alternatively, if communications device 1000 is a base station, communications device 1000 transmits downlink signals to wireless terminals. In some embodiments, the same antenna is used for transmitter module 1008 and receiver module 1004.

I/O interface 1012 couples the communications device 1000 to other network nodes e.g., other base stations, Home Agent nodes, routers AAA nodes, etc., and/or the Internet. For example, consider that communications device 1000 is a base station, I/O interface 1012 by coupling the base station to a backhaul network allows a wireless terminal using the base station as its point of network attachment to participate in a communications session with a peer node, e.g., another wireless terminal, using a different base station as its point of network attachment.

Routines 1018 include a message information generation module 1022 and a receiver control module 1024. Message information generation module 1022 generates a new set of message information, e.g., information 1032, by operations including replacing a corresponding field in a stored first set of message information with a field in a received first message.

Data/information 1020 includes a first set of message information 1026, first mobility message 1028, a received second message 1030, and a generated new set of message information 1032. Stored first set of message information 1026 corresponds to first mobility message 1028. First set of message information 1026 includes a sender identifier 1034 and one or more fields which can be replaced 1036. First mobility message 1028, e.g., a first mobility message, includes a sender identifier 1035. Received second message 1030, e.g., a mobility message, includes a compressed message indicator 1038, and one or more replacement fields 1042 corresponding to fields in information 1026. In some embodiments, the replacement field or fields 1042 includes one or more of a care-of-address 1044, an identification field 1046 and a sequence number 1048. In various embodiments, the received second message 1030 includes a mask field 1040.

Received second message 1030 is, e.g., a compressed IP mobility message.

Received second message 1040, e.g., a compressed message, is an input to message information generation module 1022, while generated new set of message information 1042 is an output of message information generation module 1022.

In some embodiments, for at least some received second messages, the compressed message indicator 1038 indicates that the second message is a compressed message which does not include at least one of a Home Agent address, a lifetime, and a Home Address. In some embodiments, for at least some received second messages, the second message does not include a mobile IP flags field. In some embodiments, the second message includes mask field 1040 which indicates the presence or absence of each field in a set of fields which may be included in the compressed message.

Figure 11:
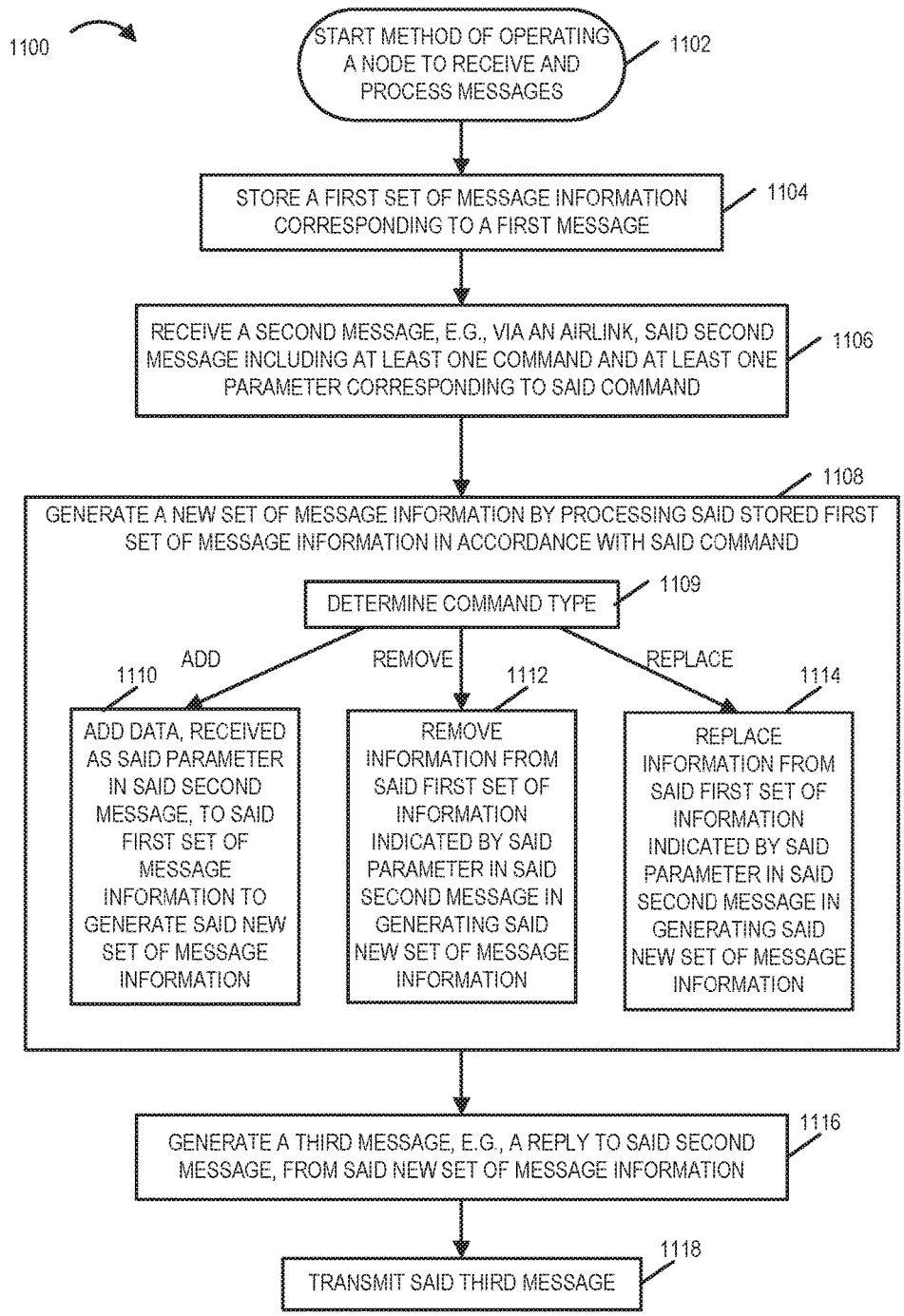
FIG. 11 is a drawing of a flowchart of an exemplary method of operating a node, e.g., a base station or a wireless terminal, to receive and process messages in accordance with various embodiments.

FIG. 11 is a drawing of a flowchart 1100 of an exemplary method of operating a node, e.g., a base station or a wireless terminal, to receive an process messages in accordance with various embodiments. Operation starts in step 1102, where the node is powered on and initialized. Operation proceeds from start step 1102 to step 1104. In step 1104, the node stores a first set of message information corresponding to a message. In some embodiments, the first message is a predetermined default message. In various embodiments, the first set of message information includes information in the first message. In some embodiments, the first set of message information includes information generated from said first message. Operation proceeds from step 1104 to step 1106. In step 1106, the node receives a second message, e.g., via an airlink, said second message including at least one command and at least one parameter corresponding to said command. In some embodiments, for at least some second messages, said parameter is data. In various embodiments, for at least some second messages, said parameter indicates a location. For example, said parameter indicates location by at least one of an offset and a size. Operation proceeds from step 1106 to step 1108.

In step 1108, the node generates a new set of message information by processing said stored first set of information in accordance with said command. Step 1108 includes sub-step 1109, 1110, 1112 and 1114. In sub-step 1109, the node determines the command type and proceeds differently depending upon the determined command type. If in sub-step 1109, the command is determined to be an ADD, then operation proceeds from sub-step 1109 to sub-step 1110. If in sub-step 1109, the command is determined to be a REMOVE, then operation proceeds from sub-step 1109 to sub-step 1112. If in sub-step 1109, the command is determined to be a REPLACE, then operation proceeds from sub-step 1109 to sub-step 1114.

In sub-step 1110, the node adds data received as said parameter in said received second message, to said first set of message information to generate said new set of message information. In sub-step 1112, the node removes information from said first set of information indicated by said parameter in said second message in generating said new set of message information. In sub-step 1114, the node replaces information from said first set of information indicated by said parameter in said second message in generating said new set of message information.

In other embodiments, different sets of commands are utilized, e.g., in step 1108. For example, one exemplary embodiment includes a set of commands including: COPY, SKIP, and ADD. Another exemplary embodiment includes a set of commands including a COPY and an ADD. Still another exemplary embodiment includes a set of commands including a DELETE and an INSERT. One exemplary embodiment includes a set of commands including a DELETE and an INSERT and at least one of: a REPLACE, an OVERWRITE, and a UINT_INCREMENT.

Operation proceeds from step 1108 to step 1116. In step 1116, the node generates a third message, e.g., a reply to said second message, from said new set of message information. Then, in step 1118, the node transmits the third message, e.g., via an airlink.

Figure 12:
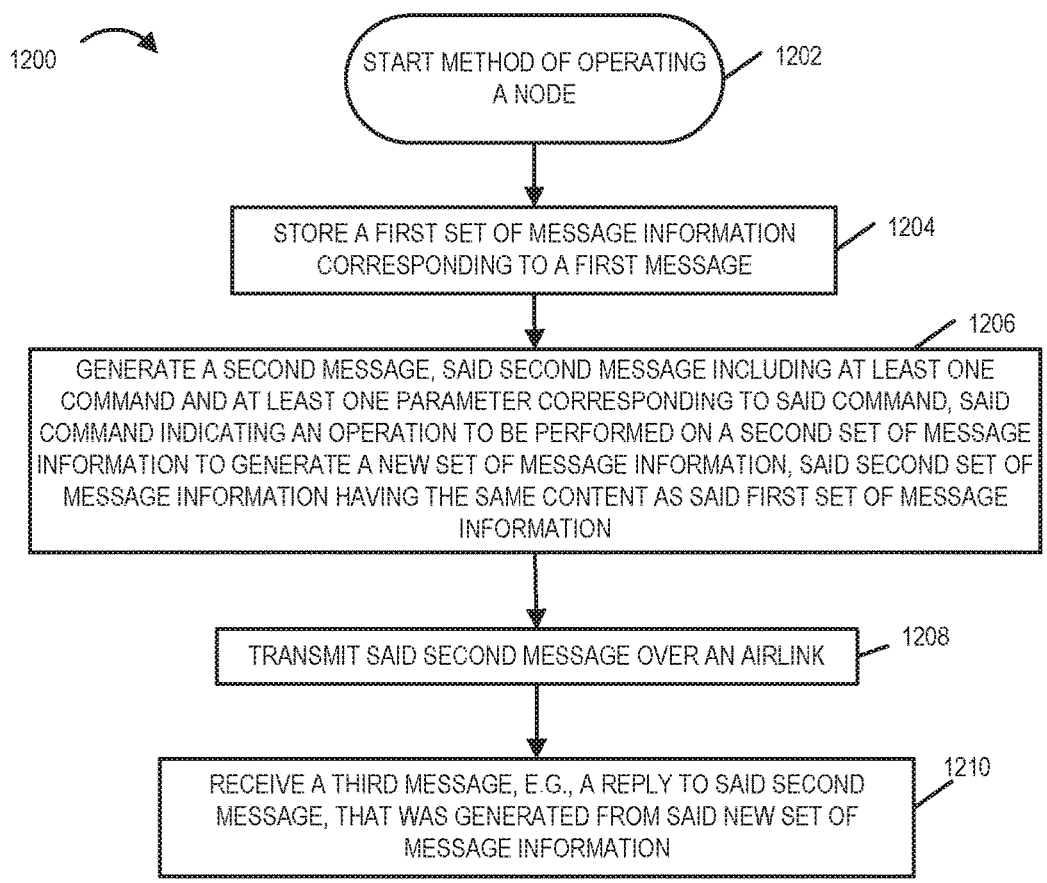
FIG. 12 is drawing of a flowchart of an exemplary method of operating a node, e.g., a wireless terminal or base station, in accordance with various embodiments.

FIG. 12 is drawing of a flowchart 1200 of an exemplary method of operating a node, e.g., a wireless terminal or base station, in accordance with various embodiments. Operation starts in step 1202, where the node is powered on and initialized and proceeds to step 1204. In step 1204, the node stores a first set of message information corresponding to a first message. Operation proceeds from step 1204 to step 1206. In step 1206, the node generates a second message, said second message including at least one command and at least one parameter corresponding to said command, said command indicating an operation to be performed on a second set of message information to generate a new set of message information, said second set of message information having the same content as said first set of message information. Operation proceeds from step 1206 to step 1208. In step 1208, the node transmits the second message over an airlink.

For example, the first message may be an uncompressed message, and the second message may be a compressed message. Consider that the node, e.g., a base station, transmits the second message over an airlink, to another node, e.g., a wireless terminal. Continuing with the example, with respect to the first message, the first set of message information corresponds to the base station's copy, while the second set of message information corresponds to the wireless terminal's copy, said first and second sets of information having the same content but being stored at different nodes. The first message may serve as a baseline with respect to the second message. The wireless terminal receiving the second message, a compressed message, uses information included in the second message and the stored second set of message information corresponding to first message, to generate a new set of message information. The new set of message information, in some embodiments, represents a decompressed copy of the second message.

In some embodiments, the second message includes an indicator, e.g., a sequence number, time tag number, id value, etc., identifying at least one of the first and second set of message information, thereby identifying the second set of message information to be used to generate said new set of message information. For example, the indicator may be used to identify a set of information corresponding to the first message from among multiple sets of stored message information such that the appropriate information is used as the baseline information with respect to the second message, the second message being a compressed message.

In various embodiments, the first set of message information includes information in said first message. In some embodiments, the first set of message information includes information generated from said first message. In some embodiments, said parameter included in said second message is data. In some embodiments, said parameter included in said second message indicates a location, e.g., by at least one of an offset and a size.

In various embodiments, the command included in said second message can be, and sometimes is, an ADD command indicating that the new set of message information is to be generated by adding data included as said parameter in said second message to said second set of message information to generate said new set of message information. In various embodiments, the command included in said second message can be, and sometimes is, a REMOVE command indicating that said parameter included in said second message indicates information to be removed from said second set of information when generating said new set of information. In various embodiments, the command included in said second message can be, and sometimes is, a REPLACE command indicating that said parameter included in said second message indicates information to be replaced from in second set of information when generating said new set of information.

Different embodiments may utilize different sets of commands. For example, one exemplary embodiment includes a set of commands including: COPY, SKIP, and ADD. Another exemplary embodiment includes a set of commands including a COPY and an ADD. Still another exemplary embodiment includes a set of commands including a DELETE and an INSERT. One exemplary embodiment includes a set of commands including a DELETE and an INSERT and at least one of: a REPLACE, an OVERWRITE, and a UINT_INCREMENT.

Operation proceeds from step 1208 to step 1210. In step 1210, the node receives a third message, e.g., a reply to the second message, that was generated from said new set of message information.

Figure 13:
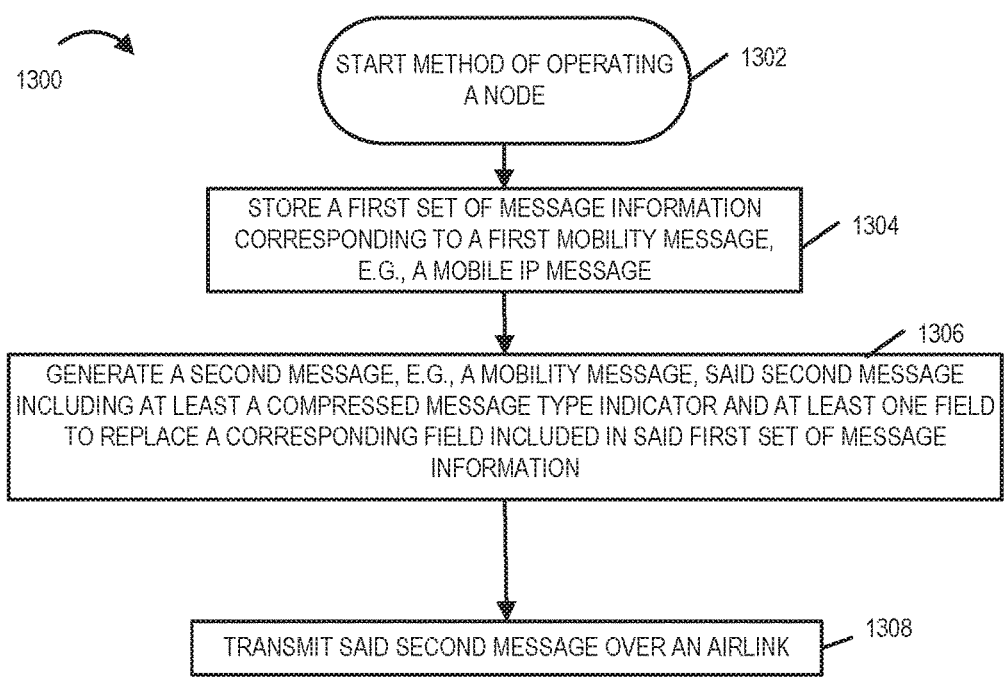
FIG. 13 is a flowchart of an exemplary method of operating a node, e.g., a base station or wireless terminal, in accordance with various embodiments.

FIG. 13 is a flowchart 1300 of an exemplary method of operating a node, e.g., a base station or wireless terminal, in accordance with various embodiments. Operation starts in step 1302, where the node is powered on and initialized. Operation proceeds from start step 1302 to step 1304. In step 1304, the node stores a first set of message information corresponding to a first mobility message, e.g., a mobile IP message. Operation proceeds from step 1304 to step 1306. In step 1306, the node generates a second message, e.g., a mobility message, said second message including at least a compressed message type indicator and at least one field to replace a corresponding field included in said first set of message information. Then, in step 1308, the node transmits the second message over an airlink.

In various embodiments, the first mobility message includes at least a sender identifier. In some embodiments, the at least one field includes a care-of-address. In some embodiments, the at least one field is one of an identification field and a sequence number field.

In various embodiments, the compressed message type indicator can, and sometimes does, indicate that said second message is a compressed message which does not include at least one of a Home Agent address, a lifetime, and a Home Address. In some such embodiments, the second message does not include a mobile 1P flags field. In some embodiments, the second message includes a mask field indicating the presence or absence of each field in a set of fields which may be included in said compressed message.

Figure 14:
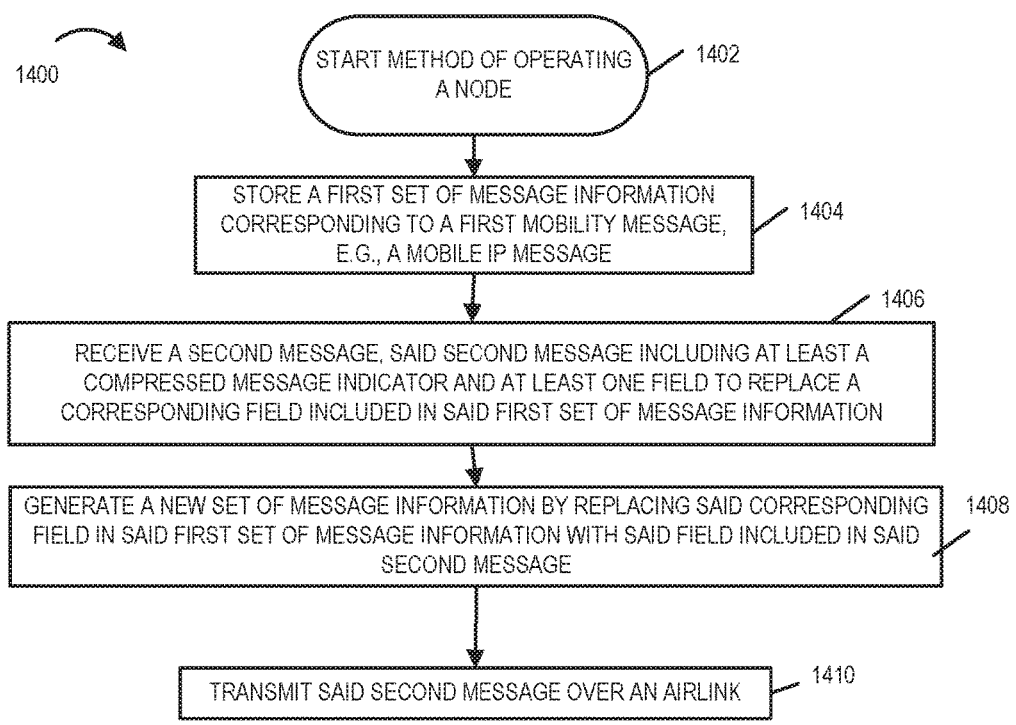
FIG. 14 is a drawing of a flowchart of an exemplary method of operating a node, e.g., a wireless terminal or base station, in accordance with various embodiments.

FIG. 14 is a drawing of a flowchart 1400 of an exemplary method of operating a node, e.g., a wireless terminal or base station, in accordance with various embodiments. Operation starts in step 1402, where the node is powered on and initialized, and proceeds to step 1404. In step 1404, the node stores a first set of message information corresponding to a first mobility message, e.g., a mobility IP message. In some embodiments, the first mobility message includes at least a sender identifier. Then, in step 1406, the node receives, e.g., via a wireless communications channel, a second message, said second message including at least a compressed message indicator and at least one field to replace a corresponding field in said first set of message information. The second message is, in some embodiments, a mobility message, e.g., a mobility IP message.

In various embodiments, the at least one field includes a care-of-address. In some embodiments, the at least one field is one of an identification field and a sequence number field.

In various embodiments, the compressed message type indicator can, and sometimes does, indicate that said second message is a compressed message which does not include at least one of a Home Agent address, a lifetime, and a Home Address. In some such embodiments, the second message does not include a mobile IP flags field. In some embodiments, the second message includes a mask field indicating the presence or absence of each field in a set of fields which may be included in said compressed message.

Operation proceeds from step 1406 to step 1408. In step 1408 the node generates a new set of message information by operation including replacing said corresponding field in said first set of message information with said field included in said second message. Then, in step 1410, the node transmits said second message over an airlink.

While described in the context of an exemplary OFDM system, the methods and apparatus of various embodiments, are applicable to a wide range of communications systems including many non-OFDM and/or non-cellular systems. The message compression methods and apparatus while useful in wireless communications systems can be used in other types of communications systems as well and are not to be limited to wireless communications system implementations.

In various embodiments nodes described herein are implemented using one or more modules to perform the steps corresponding to one or more methods, for example, signal processing, message generation and/or transmission steps. Thus, in some embodiments various features are implemented using modules. Such modules may be implemented using software, hardware or a combination of software and hardware. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium including machine executable instructions for causing a machine, e.g., processor and associated hardware, to perform one or more of the steps of the above-described method(s).

Numerous additional variations on the methods and apparatus of the embodiments described above will be apparent to those skilled in the art in view of the above descriptions. Such variations are to be considered within scope. The methods and apparatus of various embodiments may be, and in various embodiments are, used with CDMA, orthogonal frequency division multiplexing (OFDM), and/or various other types of communications techniques which may be used to provide wireless communications links between access nodes and mobile nodes. In some embodiments the access nodes are implemented as base stations which establish communications links with mobile nodes using OFDM and/or CDMA. In various embodiments the mobile nodes are implemented as notebook computers, personal data assistants (PDAs), or other portable devices including receiver/transmitter circuits and logic and/or routines, for implementing the methods.

The techniques of various embodiments may be implemented using software, hardware and/or a combination of software and hardware. Various embodiments are directed to apparatus, e.g., processors, mobile nodes such as mobile terminals, base stations, communications systems and/or other systems or devices which implement various feature or steps of a method. Various embodiments are also directed to methods, e.g., method of controlling and/or operating processors, mobile nodes, base stations and/or communications systems, e.g., hosts. Various embodiments are also directed to machine readable medium, e.g., ROM, RAM, CDs, hard discs, etc., which include machine readable instructions for controlling a machine to implement one or more steps of a method.

What is claimed is:

1. A method of receiving and processing messages, comprising:
   receiving, at a first node, a first message from a second node;
   storing, at the first node, a first set of message information corresponding to the first message;
   receiving, at the first node, a second message from the second node, wherein the second message is differentially encoded with respect to the first message, wherein the second message has a reduced message size with respect to the first message, and wherein the second message indicates what changes are to be made to the first message, said second message including at least one command and at least one parameter corresponding to said at least one command, wherein the at least one command comprises a command to add data to the first set of message information, a command to remove the data from the first set of message information, or a command to replace information in the first set of message information with the data; and
   generating a new set of message information by processing said stored first set of message information in accordance with said at least one command.

2. The method of claim 1, wherein said first message is a predetermined default message.

3. The method of claim 1, wherein said first set of message information includes information in said first message.

4. The method of claim 1, wherein said first set of message information includes information generated from said first message.

5. The method of claim 1, wherein said parameter is data.

6. The method of claim 5,
wherein generating said new set of message information includes adding said data to said first set of message information to generate said new set of message information.

7. The method of claim 5,
wherein said parameter further includes information indicating information to be replaced in said first set of message information by said data.

8. The method of claim 1, wherein said parameter indicates a location in a message.

9. The method of claim 8, wherein said parameter indicates said location by at least one of an offset and a size.

10. The method of claim 1,
wherein said parameter indicates information to be removed from said first set of message information; and
wherein generating a new set of information includes implementing said at least one command.

11. The method of claim 1, wherein receiving said second message includes: receiving the second message from an airlink.

12. The method of 1, further comprising:
generating a third message from said new set of message information; and transmitting said third message.

13. The method of claim 12, wherein said third message is a reply to said second message.

14. The method of claim 1, wherein said method is performed by a wireless terminal.

15. The method of claim 1, wherein said method is performed by a base station.

16. A first communications apparatus, comprising:
memory configured to store a first set of message information corresponding to a first message;
a receiver module configured to receive, at the first communications apparatus, the first message and a second message from a second communications apparatus, wherein the second message is differentially encoded with respect to the first message, wherein the second message has a reduced message size with respect to the first message, and wherein the second message indicates what changes are to be made to the first message, said second message including at least one command and at least one parameter corresponding to said at least one command, wherein the at least one command comprises a command to add data to the first set of message information, a command to remove the data from the first set of message information, or a command to replace information in the first set of message information with the data; and
a message information generation module configured to generate a new set of message information by processing said stored first set of message information in accordance with said at least one command.

17. The first communications apparatus of claim 16, wherein said first message is a predetermined default message.

18. The first communications apparatus of claim 16, wherein said first set of message information includes information in said first message.

19. The first communications apparatus of claim 16, wherein said first set of message information includes information generated from said first message.

20. The first communications apparatus of claim 16, wherein said parameter is data.

21. The first communications apparatus of claim 20, wherein said message information generation module includes a addition module for generating said new set of message information by adding said data to said first set of message information to generate said new set of message information.

22. The first communications apparatus of claim 20,
wherein said parameter further includes information indicating information to be replaced in said first set of message information by said data; and
wherein said message information generation module includes a command implementation module for implementing said at least one command.

23. The first communications apparatus of claim 16, wherein said parameter indicates a location.

24. The first communications apparatus of claim 23, wherein said parameter indicates said location by at least one of an offset and a size.

25. The first communications apparatus of claim 16,
wherein said parameter indicates information to be removed from said first set of message information; and
wherein said message information generation module includes a removal module for generating a new set of information by removing at least some information in accordance with the remove command.

26. The first communications apparatus of claim 16, wherein said receiver module is a wireless receiver for receiving the second message from an airlink.

27. The first communications apparatus of 16, further comprising:
a message generation module for generating a third message from said new set of message information; and
a transmitter for transmitting said third message.

28. The first communications apparatus of claim 27, wherein said third message is a reply to said second message.

29. The first communications apparatus of claim 16, wherein said apparatus is a wireless terminal.

30. The first communications apparatus of claim 16, wherein said apparatus is a base station.

31. A first communications apparatus, comprising:
means for receiving, at the first communications apparatus, a first message from a second communications apparatus;
means for storing, at the first communications apparatus, information including a first set of message information corresponding to the first message;
means for receiving, at the first communications apparatus, a second message from the second communications apparatus, wherein the second message is a differentially encoded message with respect to the first message, wherein the second message has a reduced message size with respect to the first message, and wherein the second message indicates what changes are to be made to the first message, said second message including at least one command and at least one parameter corresponding to said at least one command, wherein the at least one command comprises a command to add data to the first set of message information, a command to remove the data from the first set of message information, or a command to replace information in the first set of message information with the data; and means for generating a new set of message information by processing said stored first set of message information in accordance with said at least one command.

32. The first communications apparatus of claim 31, wherein said first message is a predetermined default message.

33. The first communications apparatus of claim 31, wherein said first set of message information includes information in said first message.

34. The first communications apparatus of claim 31, wherein said first set of message information includes information generated from said first message.

35. The first communications apparatus of claim 31, wherein said parameter is data.

36. The first communications apparatus of claim 31, wherein said parameter indicates a location.

37. A non-transitory computer readable medium embodying machine executable instructions for controlling a first communications device to:
   receive, at the first communications device, a first message from a second communications device;
   store, at the first communications device, a first set of message information corresponding to the first message;
   receive, at the first communications device, a second message from the second communications device, wherein the second message is differentially encoded with respect to the first message, wherein the second message has a reduced message size with respect to the first message, and wherein the second message indicates what changes are to be made to the first message, said second message including at least one command and at least one parameter corresponding to said at least one command, wherein the at least one command comprises a command to add data to the first set of message information, a command to remove the data from the first set of message information, or a command to replace information in the first set of message information with the data; and
   generate a new set of message information by processing said stored first set of message information in accordance with said at least one command.

38. The non-transitory computer readable medium of claim 37, wherein said first message is a predetermined default message.

39. The non-transitory computer readable medium of claim 37, wherein said first set of message information includes information in said first message.

40. The non-transitory computer readable medium of claim 37, wherein said first set of message information includes information generated from said first message.

41. The non-transitory computer readable medium of claim 37, wherein said parameter is data.

42. The non-transitory computer readable medium of claim 37, wherein said parameter indicates a location.

43. A first communications device operable in a wireless communications system, the first communications device comprising:
   a processor configured to:
   receive, at the first communications device, a first message from a second communications device;
   store, at the first communications device, a first set of message information corresponding to the first message;
   receive, at the first communications device, a second message from the second communications device, wherein the second message is differentially encoded with respect to the first message, wherein the second message has a reduced message size with respect to the first message, and wherein the second message indicates what changes are to be made to the first message, said second message including at least one command and at least one parameter corresponding to said at least one command, wherein the at least one command comprises a command to add data to the first set of message information, a command to remove the data from the first set of message information, or a command to replace information in the first set of message information with the data; and
   generate a new set of message information by processing said stored first set of message information in accordance with said at least one command.

44. The first communications device of claim 43, wherein said first message is a predetermined default message.

45. The first communications device of claim 43, wherein said first set of message information includes information in said first message.

46. The first communications device of claim 43, wherein said first set of message information includes information generated from said first message.

47. The first communications device of claim 43, wherein said parameter is data.

48. The first communications device of claim 43, wherein said parameter indicates a location.

49. A method, comprising:
   storing, at a first node, a first set of message information corresponding to a first message;
   generating, at the first node, a second message differentially encoded with respect to the first message, wherein the second message has a reduced message size with respect to the first message, said second message including at least one command and at least one parameter corresponding to said at least one command, said at least one command indicating an operation to be performed on a second set of message information to generate a new set of message information, wherein the second set of message information is stored at a second node, said second set of message information having the same content as said first set of message information, wherein the at least one command comprises a command to add data to the second set of message information, a command to remove the data from the second set of message information, or a command to replace information in the second set of message information with the data; and
   transmitting the second message to the second node.

50. The method of claim 49, wherein said second message includes an indicator
   identifying at least one of the first and the second set of message information, thereby identifying the second set of message information to be used to generate said new set of message information.

51. The method of claim 49, wherein said first set of message information includes information in said first message.

52. The method of claim 49, wherein said first set of message information includes information generated from said first message.

53. The method of claim 49, wherein said parameter is data.

54. The method of claim 53,
   wherein said at least one command indicates that said new set of message information is to be generated by adding said data to said second set of message information to generate said new set of message information.

55. The method of claim 53, wherein the at least one command further includes information indicating information to be replaced in said second set of message information by said data.

56. The method of claim 49, wherein said parameter indicates a location in a message.

57. The method of claim 56, wherein said parameter indicates said location by at least one of an offset and a size.

58. The method of claim 49, wherein said parameter indicates information to be removed from said second set of message information.

59. The method of claim 49, wherein the second message is transmitted over an airlink.

60. The method of 49, further comprising: receiving a third message that was generated from said new set of message information.

61. The method of claim 60, wherein said third message is a reply to said second message.

62. The method of claim 49, wherein said method is performed by a wireless terminal.

63. The method of claim 49, wherein said method is performed by a base station.

64. A first communications apparatus, comprising:
memory for storing, at the first communications apparatus, a first set of message information corresponding to a first message;
a message generation module for generating, at the first communications apparatus, a second message differentially encoded with respect to the first message, wherein the second message has a reduced message size with respect to the first message, said second message including at least one command and at least one parameter corresponding to said at least one command, said at least one command indicating an operation to be performed on a second set of message information to generate a new set of message information, wherein the second set of message information is stored at a second communications apparatus, said second set of message information having the same content as said first set of message information, wherein the at least one command comprises a command to add data to the second set of message information, a command to remove the data from the second set of message information, or a command to replace information in the second set of message information with the data; and
a transmitter for transmitting the second message to the second communications apparatus.

65. The first communications apparatus of claim 64, wherein said second message includes an indicator identifying at least one of the first and the second set of message information, thereby identifying the second set of message information to be used to generate said new set of message information.

66. The first communications apparatus of claim 64, wherein said first set of message information includes information in said first message.

67. The first communications apparatus of claim 64, wherein said first set of message information includes information generated from said first message.

68. The first communications apparatus of claim 64, wherein said parameter is data.

69. The first communications apparatus of claim 68, wherein said at least one command indicates that said new set of message information is to be generated by adding said data to said second set of message information to generate said new set of message information.

70. The first communications apparatus of claim 68, wherein the at least one command further includes information indicating information to be replaced in said second set of message information by said data.

71. The first communications apparatus of claim 64, wherein said parameter indicates a location.

72. The first communications apparatus of claim 71, wherein said parameter indicates said location by at least one of an offset and a size.

73. The first communications apparatus of claim 64, wherein said parameter indicates information to be removed from said second set of message information.

74. The first communications apparatus of claim 64, wherein the second message is transmitted over an airlink.

75. The first communications apparatus of 64, further comprising:
a receiver for receiving a third message that was generated from said new set of message information.

76. The first communications apparatus of claim 75, wherein said third message is a reply to said second message.

77. The first communications apparatus of claim 64, wherein said apparatus is a wireless terminal.

78. The first communications apparatus of claim 64, wherein said apparatus is a base station.

79. A first communications apparatus, comprising:
means for storing, at the first communications apparatus, a first set of message information corresponding to a first message;
means for generating, at the first communications apparatus, a second message differentially encoded with respect to the first message, wherein the second message has a reduced message size with respect to the first message, said second message including at least one command and at least one parameter corresponding to said at least one command, said at least one command indicating an operation to be performed on a second set of message information to generate a new set of message information, wherein the second set of message information is stored at a second communications apparatus, said second set of message information having the same content as said first set of message information, wherein the at least one command comprises a command to add data to the second set of message information, a command to remove the data from the second set of message information, or a command to replace information in the second set of message information with the data; and
means for transmitting the second message to the second communications apparatus.

80. The first communications apparatus of claim 79, wherein said second message includes an indicator identifying at least one of the first and the second sets of message information, thereby identifying the second set of message information to be used to generate said new set of message information.

81. The first communications apparatus of claim 79, wherein said first set of message information includes information in said first message.

82. The first communications apparatus of claim 79, wherein said first set of message information includes information generated from said first message.

83. The first communications apparatus of claim 79, wherein said parameter is data.

84. The first communications apparatus of claim 79, wherein said parameter indicates a location.

85. A non-transitory computer readable medium embodying machine executable instructions for controlling a first communications device to:
  store, at the first communications device, a first set of message information corresponding to a first message;
  generate, at the first communications device, a second message differentially encoded with respect to the first message, wherein the second message has a reduced message size with respect to the first message, said second message including at least one command and at least one parameter corresponding to said at least one command, said at least one command indicating an operation to be performed on a second set of message information to generate a new set of message information, wherein the second set of message information is stored at a second communications device, said second set of message information having the same content as said first set of message information, wherein the at least one command comprises a command to add data to the second set of message information, a command to remove the data from the second set of message information, or a command to replace information in the second set of message information with the data; and
  transmit the second message to the second communications device.

86. The non-transitory computer readable medium of claim 85, wherein said second message
  includes an indicator identifying at least one of the first and the second sets of message information, thereby identifying the second set of message information to be used to generate said new set of message information.

87. The non-transitory computer readable medium of claim 85, wherein said first set of message information includes information in said first message.

88. The non-transitory computer readable medium of claim 85, wherein said first set of message information includes information generated from said first message.

89. The non-transitory computer readable medium of claim 85, wherein said parameter is data.

90. The non-transitory computer readable medium of claim 85, wherein said parameter indicates a location.

91. A first communications device operable in a wireless communications system, the first communications device comprising:
  a processor configured to:
  store, at the first communications device, a first set of message information corresponding to a first message; and
  generate, at the first communications device, a second message differentially encoded with respect to the first message, wherein the second message has a reduced message size with respect to the first message, said second message including at least one command and at least one parameter corresponding to said at least one command, said at least one command indicating an operation to be performed on a second set of message information to generate a new set of message information, wherein the second set of message information is stored at a second communications device, said second set of message information having the same content as said first set of message information, wherein the at least one command comprises a command to add data to the second set of message information, a command to remove the data from the second set of message information, or a command to replace information in the second set of message information with the data; and
  transmit the second message to the second communications device.

92. The first communications device of claim 91, wherein said second message
  includes an indicator identifying at least one of the first and the second set of message information, thereby identifying the second set of message information to be used to generate said new set of message information.

93. The first communications device of claim 91, wherein said first set of message information includes information in said first message.

94. The first communications device of claim 91, wherein said first set of message information includes information generated from said first message.

95. The first communications device of claim 91, wherein said parameter is data.

96. The first communications device of claim 91, wherein said parameter indicates a location.

* * * * *